(12) United States Patent
Do

(10) Patent No.: US 9,570,425 B2
(45) Date of Patent: Feb. 14, 2017

(54) DISPLAY COMPRISING ULTRA-SMALL LEDS AND METHOD FOR MANUFACTURING SAME

(71) Applicant: PSI CO., LTD., Yongin-si (KR)

(72) Inventor: Young Rag Do, Seoul (KR)

(73) Assignee: PSI CO., LTD., Gyeonggi-do (KR)

( * ) Notice: Subject to any disclaimer, the term of this patent is extended or adjusted under 35 U.S.C. 154(b) by 0 days.

(21) Appl. No.: 14/903,848

(22) PCT Filed: Jul. 8, 2014

(86) PCT No.: PCT/KR2014/006122
§ 371 (c)(1),
(2) Date: Jan. 8, 2016

(87) PCT Pub. No.: WO2015/005654
PCT Pub. Date: Jan. 15, 2015

(65) Prior Publication Data
US 2016/0211245 A1 Jul. 21, 2016

(30) Foreign Application Priority Data

Jul. 9, 2013 (KR) ........................ 10-2013-0080412

(51) Int. Cl.
*H01L 25/07* (2006.01)
*H01L 25/075* (2006.01)
(Continued)

(52) U.S. Cl.
CPC ..... *H01L 25/0753* (2013.01); *G02F 1/133603* (2013.01); *H01L 33/44* (2013.01);
(Continued)

(58) Field of Classification Search
CPC .... H01L 25/0753; H01L 33/44; H01L 33/505; H01L 33/62; H01L 2933/0025; H01L 2933/0041; H01L 2933/0066
See application file for complete search history.

(56) References Cited

FOREIGN PATENT DOCUMENTS

| KR | 1020080021023 | 3/2008 |
|---|---|---|
| KR | 100903280 | 6/2009 |

(Continued)

OTHER PUBLICATIONS

International Search Report for PCT/KR2014/006122, mailed Aug. 25, 2014, 2 pages.

*Primary Examiner* — Armando Rodriguez
(74) *Attorney, Agent, or Firm* — Hoffman Warnick LLC

(57) ABSTRACT

Provided are a display including a nano-scale LED and a method for manufacturing the same. In detail, nano-scale LED devices, each of which has a nano unit, are connected to nano-scale electrodes without electrical short-circuit to overcome a limitation in which it is difficult to allow nano-scale LED devices according to the related art to stand up and be coupled to electrodes and a limitation in which it is difficult to allow the nano-scale LED devices to be one-to-one coupled to the nano-scale electrodes different from each other, thereby realizing a display including the nano-scale LEDs. Also, the display may have superior light extraction efficiency and prevent defective pixels and the defect of the whole display due to the defects of the nano-scale LED devices, which may rarely occur, from occurring to minimize the defects of the display including the nano-scale LEDs and maintain its original function.

15 Claims, 20 Drawing Sheets

(51) Int. Cl.
*H01L 33/62* (2010.01)
*G02F 1/1335* (2006.01)
*H01L 33/44* (2010.01)
*H01L 33/50* (2010.01)

(52) U.S. Cl.
CPC ............ *H01L 33/505* (2013.01); *H01L 33/62* (2013.01); *H01L 2224/32* (2013.01); *H01L 2933/0025* (2013.01); *H01L 2933/0041* (2013.01); *H01L 2933/0066* (2013.01)

(56) References Cited

FOREIGN PATENT DOCUMENTS

| | | |
|---|---|---|
| KR | 1020100066768 | 6/2010 |
| KR | 1020100091269 | 8/2010 |
| KR | 1020120022649 | 3/2012 |
| KR | 1020120122159 | 11/2012 |
| KR | 101209449 | 12/2012 |

DISPLAY COMPRISING ULTRA-SMALL LEDS AND METHOD FOR MANUFACTURING SAME

CROSS-REFERENCE TO RELATED APPLICATIONS

This U.S. non-provisional patent application claims priority under 35 U.S.C. §119 of Korean Patent Application No. 10-2013-0080412, filed on Jul. 9, 2013, the entire contents of which are hereby incorporated by reference.

BACKGROUND OF THE INVENTION

The present invention disclosed herein relates to a display including a nano-scale LED and a method for manufacturing the same, and more particularly, to a display including a nano-scale LED in which a nano-scale LED device having a nano unit is connected to an electrode without an electrical short-circuit to realize a full-color LED display and maximize light extraction efficiency and a method for manufacturing the same.

The development of light emitting diodes (LEDs) has been actively promoted by succeeding in combination of a high-quality single-crystal gallium nitride (GaN) semiconductor by applying a low-temperature GaN compound buffer layer, by Nakamura et al., at Nichia Chemical Corporation in Japan, 1992. Such an LED is a semiconductor having a structure in which an n-type semiconductor crystal having a plurality of carriers, i.e., electrons and a p-type semiconductor crystal having a plurality of carrier, i.e., holes are junctioned to each other by using characteristics of a compound semiconductor, that is to say, a semiconductor device that converts an electrical signal into light having a desired wavelength band to emit the light. The LED semiconductor is called a revolution of light as a green material because the LED semiconductor has vary low energy consumption due to high light conversion efficiency and is semi-permanent in the lifespan and environmentally friendly. Recently, as development of compound semiconductor technologies, red, yellow, green, blue, and white LEDs having high luminance have been developed.

Thus, the development of LED lightings and LED displays using the LEDs are being continuously developed. Among these, since the LED displays are capable of being utilized as displays for small-sized electronic devices such as mobile phones and notebooks, studies on the LED displays are being actively carried out.

However, the LEDs are limitedly utilized for displays. For example, one of them may be a liquid crystal display (LCD). Since the LCD does not voluntarily generate light, a backlight for generating light has to be provided on a rear surface of a communication LED panel. White light is irradiated to the rear surface of the LCD panel to allow an image color realized by the LCD panel to be reproduced with approximation to an actual color. Although cold cathode fluorescent lamps (CCFLs) or external electrode fluorescent lamps (EEFLs) are initially used as light sources, after high efficiency light emission diodes (LEDs) having superior physical and chemical characteristics come, backlight using LEDs as light sources are being put to practical use. Furthermore, attempts to commercialize LEDs for full-color displays, but simple backlights are going on.

Particularly, due to these attempts, the current commercialized full-color LED displays have been produced as products that come in only contact with everyday lift such as displays for outdoor electronic display boards in which ten thousands to several hundred thousand of LED lamps having three primary colors, i.e., red, green, and blue colors are inserted into a large-scale board. In case of household TVs that are, so-call, called LED TVs or monitors for computers, the conventional fluorescent lamps are replaced with backlights having LED panel to LCD TVs or monitors in which white or three primary colors LED devices are adopted for backlights. Thus, the LCD TVs or motors are not LED displays in the true sense of the term.

A reason in which the existing LED devices are not developed as displays having the same size as TVs or monitors, there are fundamental limitations in technical methods for manufacturing displays and methods for realizing full colors by using the LED devices.

If a display for TVs is manufactured by using the existing LED devices, when simply calculated, about 5 to about 40 sheets of wafers, each of which has a width of about 2 inches to about 8 inches, have to be connected to each other to manufacture a TV having a width of about 40 inches. Thus, there are many limitations which are impassable through the present technologies in direct realizing of the display for the TV by using the LED devices through the presently well-known manufacturing technologies. Furthermore, to realize the full colors, since the red, green, and blue colors, i.e., three-primary color LED devices have to be inserted together into one pixel, it may be difficult to realize LED full-color displays by simply connecting red, green, and blue LED wafers to each other.

According to many studies that are known until now to realize high-efficiency LED displays, in case of a bottom-up method in which the group III-V thin films and nanorod LED devices are directly grown on a patterned pixel of a glass substrate having a large area for actual displays, it may be crystallographically very difficult to directly deposit the group III-V thin films on the large-scaled substrate having the same size as the displays for the TVs or grow the group III-V thin films having high crystalline and efficiency and the nanorod LED device on a patterned transparent electrode of the transparent amorphous glass substrate. Due to the technical limitation as described above, the method in which the LED devices are directly grown on the large-area glass substrate to realize the full-color display for the TVs or monitors is not nearly attempted.

The other method that proceeds by many researchers to realize the LED displays is a bottom-up method based on nano technologies. This method may be a method in which a nanorod LED is grown on a single crystal substrate and then portions of the grown nanorod LED are separated and rearranged on the electrode that is patterned by pixels by using the bottom-up method to realize the large-area display. However, the nanorod LED that is manufactured by using the bottom-up method may have a limitation in that light emitting efficiency is poor when compared to that of the existing thin film type LED that is grown on the wafer.

Further another method is a top-down method in which a high-efficiency LED device is cut to realize an LED display. In general, this method may be a method in which micro LED devices manufactured by using the top-down method are arranged one by one on sub pixels of the large-area glass substrate to one-to-one correspond to each other, thereby realizing the display. In this case, since an LED device is grown on a sapphire substrate and then patterned to a micro size to manufacture a micro LED device to be connected to the electrode, a micro LED display that has a size less than that of the wafer may be realized.

The above-described last method may be preferable in realizing of the LED display under the present technical level. However, in an electrode line of the manufactured LED device, if the other electrode is stacked by using the bottom-up method and then is three-dimensionally coupled to the electrode line, the LED device has to three-dimensionally stand up between the two electrodes different from each other and then is coupled to the two electrodes. This method may be possible in case of the general LED device. However, if the LED device is manufactured to a nano-scale LED device, it may be difficult to three-dimensionally stand up on the electrode, and thus, a portion of the electrode devices may be laid to cause pixel defects.

Also, even though the nano-scale LED device three-dimensionally stands up on the electrode, it may be difficult to one-to-one couple the LED devices to the nano-scale electrodes different from each other. Furthermore, even though the LED devices are one-to-one coupled to the two electrodes, it may be very difficult to electrically connect the LED devices to the two electrodes without causing electrical short-circuit. Although only one to two pixels are defective as described above, the whole display may be defective to cause defects of the display itself.

Korean Patent Application No. 2011-0040925 by the inventor of this application discloses a structure in which a nano-scale LED device three-dimensionally stands up and then is coupled to an electrode to realize a display device, and also, a structure in which a coupling link is disposed on a lower portion of the nano-scale LED device so that the nano-scale LED device easily and three-dimensionally stands up and is couple the LED device. However, in the actual realization of the display device, it may be very difficult to allow the nano-scale LED device to three-dimensionally stand up and be coupled to the electrode.

Also, if only one LED having a micro unit corresponds to each pixel, the defect of the LED may be regarded as a pixel defect.

Furthermore, since the sub pixel formed in the display is disposed on the electrode, even though the nano-scale LED having a nano unit three-dimensionally stands up and is coupled to the electrode, photons generated in an active layer of the nano-scale LED device may not be completely extracted although the photons are interdigitatedly disposed in a nano device and an insulation layer. Thus, light may be totally reflected by a surface formed between a surface of the standing LED device having the nano unit and an air layer to deteriorate light extraction efficiency. In addition, the photons may be blocked by the upper electrode and thus may not be extracted to the outside, but be absorbed into the active layer to deteriorate the light extraction efficiency.

Korean Patent Application No. 2006-0060461 discloses a light emitting diode display device and a method for manufacturing the same. In the disclosed light emitting diode display device, the display device constitutes one pixel and includes several LEDs. The LED is manufactured in the bottom-up method in which the nanorod LED device is directly grown. A reason in which this method is used in the foregoing invention is because it is difficult to allow the independently manufactured LED devices, i.e., several nano-scale LED devices, each of which has the nano unit, to three-dimensionally stand up and be coupled to the electrode.

However, according to the foregoing method, it may be substantially difficult to directly grow the LED devices on the large-area substrate.

Also, in case where the grown LED devices have sizes different from each other, it may be difficult to adjust density of the LED devices disposed on one pixel because the LED device is miniaturized to the nano size. Furthermore, it may be difficult to integrate the LED devices to high density, and since the electrode is disposed on each of upper and lower portions of the LED device, the photons generated in the LED device are totally reflected by a difference in refractive index and are not emitted to the outside due to the blocking of the electrode and thus captured or absorbed in the electrode layer. Thus, the deterioration in light extraction efficiency may not be solved.

SUMMARY OF THE INVENTION

The present invention provides a method for manufacturing a display including a nano-scale LED, in which independently manufactured nano-scale ELD devices, each of which has a nano unit, are connected to two electrodes different from each other without causing defects to realize a large-area color by blue LED or RGB full-color LED display and maximize light extraction efficiency.

The present invention also provides a method for manufacturing a display including a nano-scale LED, in which nano-scale LED devices are aggregated at only a specific portion on an electrode assembly region or concentratedly distributed on a desired mounting region without being spread to the outside.

The present invention also provides a display including a nano-scale LED, in which nano-scale LED devices are connected to two electrodes different from each other without electrical short-circuit to realize a large-area color by blue LED or RGB full-color LED display, maximize light extraction efficiency, and minimize display defects due to pixel defects.

In one embodiment of the present invention, a method for manufacturing a display including a nano-scale LED assembly includes: (1) forming an electrode I on a substrate; (2) forming an electrode II on the same plane as the electrode I or on the electrode I to form a plurality of electrode assembles including a first electrode connected to the electrode I and a second electrode spaced apart from the first electrode on the same plane as the first electrode and connected to the electrode II; (3) injecting a solution containing a plurality of nano-scale LED devices onto a plurality of sub pixel sites formed on the plurality of electrode assembles; and (4) applying power to the plurality of electrode assembles to form a plurality of sub pixels including the plurality of nano-scale LED devices connected to both of the first and second electrodes, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm$<X\leq 10$ μm, 100 nm$<Y\leq 10$ μm, and 100 nm$<Z\leq 10$ μm.

The method may further includes forming an insulation barrier surrounding the plurality of sub pixel sites formed on the plurality of electrode assembles on the substrate in addition to the electrode assembly between the step (2) and the step (3).

The width X of the first electrode, the width Y of the second electrode, the distance Z between the first electrode and the second electrode adjacent to the first electrode, and the length H may satisfy following relation expression 2.

$$Z \leq H \leq X+Y+Z,\qquad \text{[Relation Expression 2]}$$

where 100 nm<X≤10 μm, 100 nm<Y≤10 μm, and 100 nm<Z≤10 μm.

The nano-scale LED device in the step (3) may have a length of about 100 nm to about 10 μm and an aspect ratio of about 1.2 to about 100.

The nano-scale LED device in the step (3) may include a blue LED device.

The power in the step (4) may have a voltage of about 0.1 V to about 1,000 V and a frequency of about 10 Hz to about 100 GHz.

The power in the step (4) may have a voltage of about 0.1 V to about 1,000 V and a frequency of about 10 Hz to about 100 GHz, and the number of nano-scale LED devices provided per an area (100×100 μm$^2$) of the sub pixel site in the step (4) is about 2 to about 100,000.

In another embodiment, the method may further include forming an insulation layer including the electrode I on the substrate between the step (1) and the step (2), after the step (4), the method may further include: (5) forming a metal ohmic layer including connection portions between the first and second electrodes provided on the plurality of sub pixels and the nano-scale LED devices; (6) forming a short-wave pass filter (SPDF) on an upper portion of each of the plurality of sub pixels including the metal ohmic layer; (7) patterning a green color conversion layer on an upper portion of the short-wave pass filter (SPDF) corresponding to the selected sub pixels of the plurality of sub pixels and patterning a red color conversion layer on an upper portion of the short-wave pass filter (SPDF) corresponding to the selected sub pixels of the plurality of sub pixels; and (8) forming a long-wave pass filter (LPDF) on upper portions of the green color conversion layer and the red color conversion layer.

In further another embodiment, a method for manufacturing a display including a nano-scale LED assembly includes: (1) forming an electrode I on a substrate; (2) forming an electrode II on the same plane as the electrode I or on the electrode I to form a plurality of electrode assembles including a first electrode connected to the electrode I and a second electrode spaced apart from the first electrode on the same plane as the first electrode and connected to the electrode II; (3) injecting a plurality of nano-scale LED devices onto a plurality sub pixel sites formed on the plurality of electrode assembles; and (4) injecting a solvent to the plurality of sup pixel sites and applying power to the plurality of electrode assembles to form a plurality of sub pixels including a plurality of nano-scale LED devices connected to both of the first and second electrodes; wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,\qquad \text{[Relation Expression 1]}$$

where 100 nm<X≤10 μm, 100 nm<Y≤10 μm, and 100 nm<Z≤10 μm.

The method may further includes forming an insulation barrier surrounding the plurality of sub pixel sites formed on the plurality of electrode assembles on the substrate in addition to the electrode assembly between the step (2) and the step (3).

The width X of the first electrode, the width Y of the second electrode, the distance Z between the first electrode and the second electrode adjacent to the first electrode, and the length H may satisfy following relation expression 2.

$$Z \leq H \leq X+Y+Z,\qquad \text{[Relation Expression 2]}$$

where 100 nm<X≤10 μm, 100 nm<Y≤10 μm, and 100 nm<Z≤10 μm.

The nano-scale LED device in the step (3) may have a length of about 100 nm to about 10 μm and an aspect ratio of about 1.2 to about 100.

The nano-scale LED device in the step (3) may include a blue LED device.

The power in the step (4) may have a voltage of about 0.1 V to about 1,000 V and a frequency of about 10 Hz to about 100 GHz.

The number of nano-scale LED devices provided per an area (100×100 μm$^2$) of the sub pixel site in the step (4) is about 2 to about 100,000.

In further another embodiment, the method may further include forming an insulation layer including the electrode I on the substrate between the step (1) and the step (2), after the step (4), the method may further include: (5) forming a metal ohmic layer including connection portions between the first and second electrodes provided on the plurality of sub pixels and the nano-scale LED devices; (6) forming a short-wave pass filter (SPDF) on an upper portion of each of the plurality of sub pixels including the metal ohmic layer; (7) patterning a green color conversion layer on an upper portion of the short-wave pass filter (SPDF) corresponding to the selected sub pixels of the plurality of sub pixels and patterning a red color conversion layer on an upper portion of the short-wave pass filter (SPDF) corresponding to the selected sub pixels of the plurality of sub pixels; and (8) forming a long-wave pass filter (LPDF) on upper portions of the green color conversion layer and the red color conversion layer.

In further another embodiment, a display including a nano-scale LED includes: an electrode I disposed on a substrate; an electrode II on the same plane as the electrode I or on the electrode I; a plurality of electrode assembles including a first electrode connected to the electrode I and a second electrode spaced apart from the first electrode on the same plane as the first electrode and connected to the electrode II; and a plurality of nano-scale LED devices connected to both of the first and second electrodes provided on a plurality of sub pixel sites disposed on the plurality of electrode assembles, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm$<$X$\leq$10 μm, 100 nm$<$Y$\leq$10 μm, and 100 nm$<$Z$\leq$10 μm.

The display may further include: an insulation layer including the electrode I and disposed on the substrate and under the electrode II; a metal ohmic layer including connection portions between the first and second electrodes disposed on a plurality of sub pixels and the nano-scale LED devices; a short-wave pass filter (SPDF) disposed on an upper portion of each of the plurality of sub pixels including the metal ohmic layer; a green color conversion layer patterned on an upper portion of the short-wave pass filter (SPDF) corresponding to the selected sub pixels of the plurality of sub pixels and a red color conversion layer patterned on an upper portion of the short-wave pass filter (SPDF) corresponding to the selected sub pixels of the plurality of sub pixels; and a long-wave pass filter (LPDF) disposed on upper portions of the green color conversion layer and the red color conversion layer.

The electrodes I and II may cross each other in a strip shape, the sub pixel sites are disposed in a space partitioned by the electrodes I and II, and the sub pixel sites are disposed in a space that is partitioned by the electrode I and II crossing each other.

The first and second electrodes are spiral or interdigitatedly disposed to be spaced apart from each other.

The number of nano-scale LED devices provided per an area (100×100 μm$^2$) of the sub pixel site is about 2 to about 100,000.

The nano-scale LED device may have a length of about 100 nm to about 10 μm and an aspect ratio of about 1.2 to about 100.

The width X of the first electrode, the width Y of the second electrode, the distance Z between the first electrode and the second electrode adjacent to the first electrode, and the length H may satisfy following relation expression 2.

$$Z \leq H \leq X+Y+Z,$$ [Relation Expression 2]

where 100 nm$<$X$\leq$10 μm, 100 nm$<$Y$\leq$10 μm, and 100 nm$<$Z$\leq$10 μm.

The nano-scale LED device may include a blue LED device.

In further another embodiment, a method for manufacturing a display including a nano-scale LED assembly includes: (1) forming an electrode I on a substrate; (2) forming an electrode II on the same plane as the electrode I or on the electrode I to form a plurality of electrode assembles including the first electrode connected to the electrode I and a second electrode spaced apart from the first electrode on the same plane as the first electrode and connected to the electrode II; (3) independently injecting a first solution containing a plurality of blue nano-scale LED devices, a second solution containing a plurality of green nano-scale LED devices, and a third solution containing a plurality of red nano-scale LED devices onto a plurality of sub pixel sites formed on the plurality of electrode assembles; and (4) applying power to the plurality of electrode assembles to form a plurality of sub pixels including the plurality of nano-scale LED devices connected to both of the first and second electrodes, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm$<$X$\leq$10 μm, 100 nm$<$Y$\leq$10 μm, and 100 nm$<$Z$\leq$10 μm.

The first and second electrodes are spiral or interdigitatedly disposed to be spaced apart from each other.

The nano-scale LED device in the step (3) may have a length of about 100 nm to about 10 μm and an aspect ratio of about 1.2 to about 100.

The width X of the first electrode, the width Y of the second electrode, the distance Z between the first electrode and the second electrode adjacent to the first electrode, and the length H may satisfy following relation expression 2.

$$Z \leq H \leq X+Y+Z,$$ [Relation Expression 2]

where 100 nm$<$X$\leq$10 μm, 100 nm$<$Y$\leq$10 μm, and 100 nm$<$Z$\leq$10 μm.

The power in the step (4) may have a voltage of about 0.1 V to about 1,000 V and a frequency of about 10 Hz to about 100 GHz.

The number of nano-scale LED devices provided per an area (100×100 μm$^2$) of the sub pixel site in the step (4) is about 2 to about 100,000.

The method may further include forming an insulation layer including the electrode I on the substrate between the step (1) and the step (2), after the step (4), the method may further include: (5) forming a metal ohmic layer including connection portions between the first and second electrodes provided on the plurality of sub pixels and the nano-scale LED devices; and (6) forming a passivation layer on an upper portion of each of the plurality of sub pixels including the metal ohmic layer.

The method may further include forming an insulation barrier surrounding the plurality of sub pixel sites formed on the plurality of electrode assembles on the substrate in addition to the electrode assembles between the step (2) and the step (3).

In further another embodiment, a method for manufacturing a display including a nano-scale LED assembly includes: (1) forming an electrode I on a substrate; (2) forming an electrode II on the same plane as the electrode I or on the electrode I to form a plurality of electrode assemblies including a first electrode connected to the electrode I and a second electrode spaced apart from the first electrode on the same plane as the first electrode and connected to the electrode II; (3) independently injecting a plurality of blue nano-scale LED devices, a plurality of green nano-scale LED devices, and a plurality of red nano-scale LED devices onto a plurality of sub pixel sites formed on the plurality of electrode assemblies; and (4) injecting a solvent to the plurality of sup pixel sites and applying power to the plurality of electrode assemblies to form a plurality of sub pixels including a plurality of nano-scale LED devices connected to both of the first and second electrodes; wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z, \qquad \text{[Relation Expression 1]}$$

where 100 nm$<$X$\leq$10 μm, 100 nm$<$Y$\leq$10 μm, and 100 nm$<$Z$\leq$10 μm.

The first and second electrodes are spiral or interdigitatedly disposed to be spaced apart from each other.

The nano-scale LED device in the step (3) may have a length of about 100 nm to about 10 μm and an aspect ratio of about 1.2 to about 100.

The width X of the first electrode, the width Y of the second electrode, the distance Z between the first electrode and the second electrode adjacent to the first electrode, and the length H may satisfy following relation expression 2.

$$Z \leq H \leq X+Y+Z, \qquad \text{[Relation Expression 2]}$$

where 100 nm$<$X$\leq$10 μm, 100 nm$<$Y$\leq$10 μm, and 100 nm$<$Z$\leq$10 μm.

The nano-scale LED device in the step (3) may include a blue LED device.

The power in the step (4) may have a voltage of about 0.1 V to about 1,000 V and a frequency of about 10 Hz to about 100 GHz.

The number of nano-scale LED devices provided per an area (100×100 μm$^2$) of the sub pixel site in the step (4) is about 2 to about 100,000.

The method may further include forming an insulation layer including the electrode I on the substrate between the step (1) and the step (2), after the step (4), the method may further include: (5) forming a metal ohmic layer including connection portions between the first and second electrodes provided on the plurality of sub pixels and the nano-scale LED devices; and (6) forming a passivation layer on an upper portion of each of the plurality of sub pixels including the metal ohmic layer.

The method further include forming an insulation barrier surrounding the plurality of sub pixel sites formed on the plurality of electrode assemblies on the substrate in addition to the electrode assemblies between the step (2) and the step (3).

In further another embodiment, a display including a nano-scale LED includes: an electrode I disposed on a substrate; an electrode II on the same plane as the electrode I or on the electrode I; a plurality of electrode assemblies including a first electrode connected to the electrode I and a second electrode spaced apart from the first electrode on the same plane as the first electrode and connected to the electrode II; and a plurality of nano-scale LED devices connected to both of the first and second electrodes provided on a plurality of sub pixel sites disposed on the plurality of electrode assemblies, wherein the nano-scale LED devices include: a plurality of blue nano-scale LED devices, green nano-scale LED devices, and red nano-scale LED devices, wherein the nano-scale LED devices that emit light having one kind of color are disposed on each of the sub pixel sites, each of the nano-scale LED device includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z, \qquad \text{[Relation Expression 1]}$$

where 100 nm$<$X$\leq$10 μm, 100 nm$<$Y$\leq$10 μm, and 100 nm$<$Z$\leq$10 μm.

The display may further include: an insulation layer including the electrode I and disposed on the substrate and under the electrode II; a metal ohmic layer including connection portions between the first and second electrodes disposed on a plurality of sub pixels and the nano-scale LED devices.

The electrodes I and II may cross each other in a strip shape, the sub pixel sites are disposed in a space partitioned by the electrodes I and II, and the sub pixel sites are disposed in a space that is partitioned by the electrode I and II crossing each other.

The first and second electrodes are spiral or interdigitatedly disposed to be spaced apart from each other.

The number of nano-scale LED devices provided per an area (100×100 μm$^2$) of the sub pixel site is about 2 to about 100,000.

The nano-scale LED device may have a length of about 100 nm to about 10 μm and an aspect ratio of about 1.2 to about 100.

The width X of the first electrode, the width Y of the second electrode, the distance Z between the first electrode and the second electrode adjacent to the first electrode, and the length H may satisfy following relation expression 2.

$$Z \leq H \leq X+Y+Z, \qquad \text{[Relation Expression 2]}$$

where 100 nm$<$X$\leq$10 μm, 100 nm$<$Y$\leq$10 μm, and 100 nm$<$Z$\leq$10 μm.

The display may include an insulation barrier surrounding the plurality of sub pixel sites on the plurality of electrode assembles.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
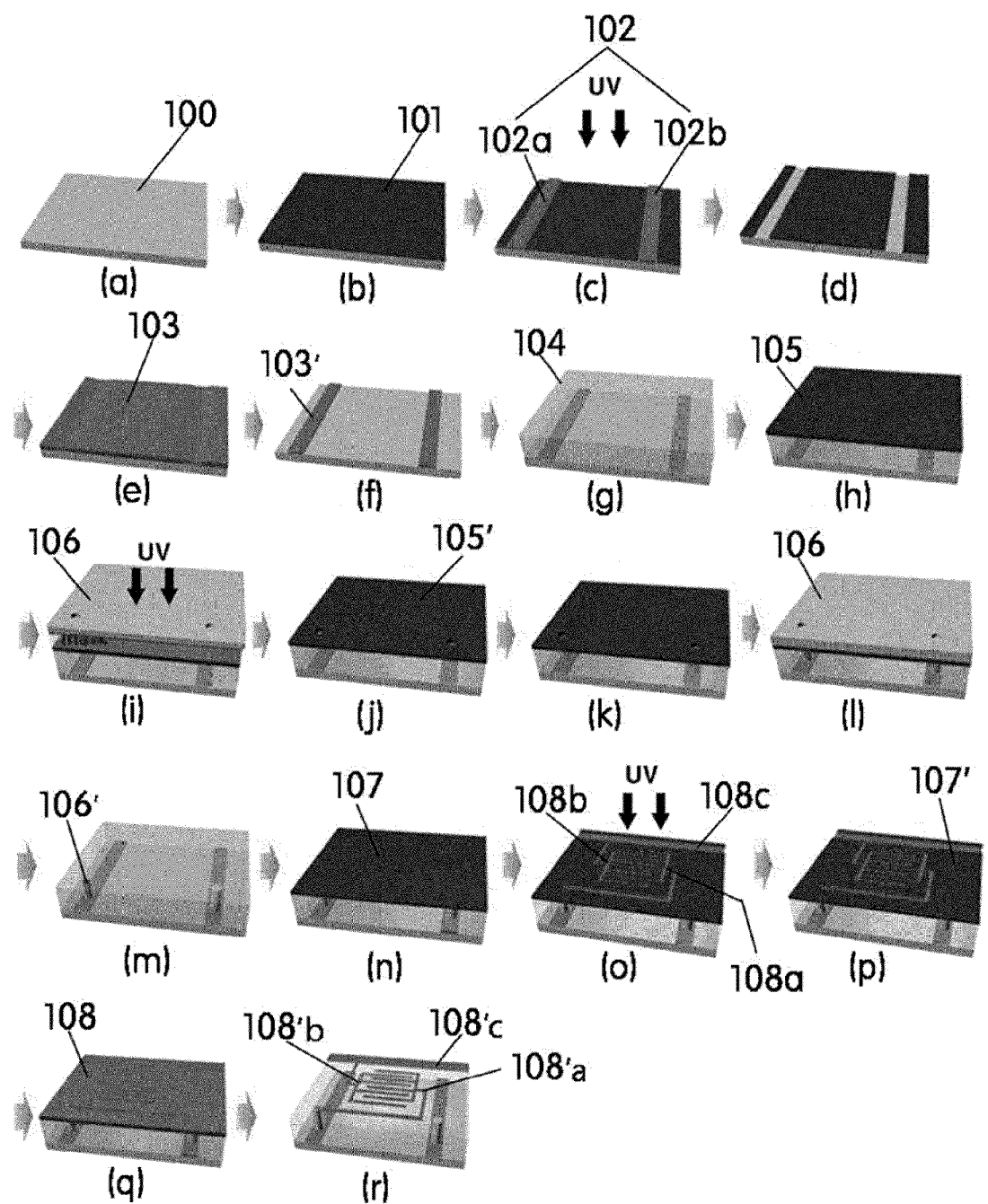
FIG. 1 is a perspective view illustrating a process of manufacturing an electrode assembly provided in a display according to an embodiment of the present invention.

Hereinafter, the terms used in the present invention will be described.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present.

In the description according to an embodiment of the present invention, the terms "first electrode" and "second electrode" may include first and second electrode disposed on an electrode area on which a nano-scale LED is substantially mounted and include an electrode area that is further provided according to a method for disposing the electrode in addition to the above-described electrode area.

In the description according to an embodiment of the present invention, a unit electrode may denote an arrangement region on which two electrodes for independently operating the arranged nano-scale LED devices are disposed, and a unit electrode area may denote an area of the arrangement region.

In the description according to an embodiment of the present invention, the term "connection" may denote a state in which the nano-scale LED device is mounted on two electrodes (e.g., a first electrode and a second electrode) different from each other. Also, the term "electrical connection" may denote a state in which a nano-scale LED device is mounted on two electrodes different from each other, and also, power is applied to an electrode assembly to allow the nano-scale LED device to emit light.

Exemplary embodiments of the present invention will now be described in detail with reference to the accompanying drawings.

As described above, in the manufacture of the display according to the related art, if the LED device is a nano-scale LED device, it may be difficult to three-dimensionally stand up and be coupled to the electrode. Also, a portion of the LED devices may be laid to cause defective pixel (see FIG. 10). Also, although the nano-scale LED three-dimensionally stands up on the electrode, it may be difficult to one-to-one couple the LED devices to the nano-scale electrodes different from each other. Also, if only one LED having a micro unit corresponds to each pixel, the defect of the LED device may be regarded as a pixel defect. Furthermore, since a sub pixel formed in the display is disposed on the electrode, even though the nano-scale LED device having a nano unit three-dimensionally stands up and is coupled to the electrode, photons generated in an active layer of the nano-scale LED device may be totally reflected by an interface between an outer circumferential surface of the standing nano-scale LED device and an air layer contacting the outer circumferential surface to reduce extraction of the photons from the active layer to the air, and also, a portion of the photons may be blocked by the upper electrode and thus may not be extracted to the outside, but be absorbed into the active layer to deteriorate light extraction efficiency. Furthermore, to manufacture an LED display having high-efficiency/high-resolution, the total number of pixels has to increase within a limited area of the display, and also, the LED devices having high density have to be integrated within one pixel, but one LED device is not disposed on one pixel. Thus, if the one LED device is a nano-scale LED having the nano unit, it may be difficult to actually realize the display including the pixels.

According to a first embodiment, a method for manufacturing a display including a nano-scale LED assembly includes: (1) forming an electrode I on a substrate; (2) forming an electrode II on the same plane as the electrode I or on the electrode I to form a plurality of electrode assembles including a first electrode connected to the electrode I and a second electrode spaced apart from the first electrode on the same plane as the first electrode and connected to the electrode II; (3) injecting a solution containing a plurality of nano-scale LED devices onto a plurality of sub pixel sites formed on the plurality of electrode assembles; and (4) applying power to the plurality of electrode assembles to form a plurality of sub pixels including the plurality of nano-scale LED devices connected to both of the first and second electrodes, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm<X≤10 μm, 100 nm<Y≤10 μm, and 100 nm<Z≤10 μm.

Thus, the nano-scale LED devices having the high density may be coupled to one-to-one correspond to the two electrodes different from each other within one pixel and also be connected to the connection electrode without the electrical short-circuit. Also, photons emitted from the active layer of the nano-scale LED device may be blocked by the electrode and thus may not be extracted, but be absorbed into the device to improve the light extraction efficiency. Furthermore, due to the directivity of the nano-scale LED device connected to the electrode, the full-color LED display having more improved light extraction efficiency may be realized.

First, in a step (1), an electrode I is formed on a substrate. FIG. 1 is a perspective view illustrating a process of manufacturing an electrode assembly provided in a display according to an embodiment of the present invention. The step (1) will be described with reference to FIG. 1.

FIG. 1A illustrates a substrate 100. One of a glass substrate, a crystal substrate, a sapphire substrate, a plastic substrate, and a flexible polymer film may be used as the substrate 100. More preferably, the substrate may be transparent. However, the present invention is not limited to a kind of substrates. For example, if the substrate is used as a substrate for a general display, and a general electrode is formed on the substrate, various kinds of substrates may be used as the substrate. The substrate 100 is not limited to an area thereof and also may have an area that varies to match that of the display. For example, the substrate 100 may have a thickness of about 100 μm to about 1 mm, but is not limited thereto.

Thereafter, a photo resist (PR) 101 may be applied on the substrate 100 as illustrated in FIG. 1B. The photo resist 101 may be a photo resist that is generally used in the ordinary skilled in the art. The method for applying the photo resist on the base substrate 100 may include one of a spin coating method, a spray coating method, and a screen printing method. Preferably, the spin coating method is used, but is not limited thereto. A specific coating method may be performed by the method that is well-known in the ordinary skilled in the art. The photo resist 101 for coating may have a thickness of about 0.1 μm to about 10 μm. However, the coating photo resist 101 may have a thickness that is variable in consideration of a thickness of the electrode to be deposited on the base substrate 100.

After the photo resist 100 is formed on the substrate 101 as described above, a mask 102 having patterns 102a and 120b corresponding to the electrode I is placed on the photo resist 101 as illustrated in FIG. 1C and then be exposed to UV rays that are irradiated from an upper side of the mask 102.

Thereafter, the photo resist 101 that is not exposed may be immersed into a general photo resist solvent and then removed. Thus, an unexposed portion of the photo resist layer on which the electrode I will be formed as illustrated in FIG. 1D may be removed. Each of the patterns 102a and 120b corresponding to the electrode I may have a width of about 100 μm to about 50 μm, but is not limited thereto.

Thereafter, an electrode formation material 103 may be deposited on a portion from which the photo resist layer corresponding to the electrode I is removed as illustrated in FIG. 2E. The electrode formation material may be formed of at least metal material selected from the group consisting of aluminum, titanium, indium, gold, and silver or at least one transparent material selected from the group consisting of ITO (Indium Tin Oxide), ZnO:Al, and CNT-conductive polymer complex. If two kinds of electrode formation materials are provided, the electrode I may have a structure in which at least two kinds of materials are stacked. In more detail, the electrode I may be an electrode in which two kinds of materials, i.e., titanium/gold are stacked. However, the electrode I is not limited to the above-described materials. The electrode formation material may be deposited by using one of a thermal deposition method, an E-beam deposition method, a sputtering deposition method, and a screen printing method. Preferably, the thermal deposition method is used, but it not limited thereto.

After the electrode formation material is deposited, as illustrated in FIG. 1F, when the photo resist 101 applied on the base substrate 100 is removed by using one photo resist stripper of 1-methyl-2-pyrrolidone (NMP) and dimethyl sulfoxide (DMSO), an electrode I 103' may be formed on the substrate.

The term "on the substrate" may denote states in which the electrode is directly formed on the substrate or is spaced apart form the substrate and indirectly formed on the substrate. FIG. 1F illustrates the state in which the electrode I 103' is directly formed on a surface of the substrate. For example, the electrode I may have a width of about 100 nm to about 50 µm and a thickness of about 0.1 µm to about 10 µm. However, the present invention is not limited thereto. For example, the width and thickness may be changed according to a size of a sub pixel that will be described below. More preferably, the electrode I may have a width that is less than a half of a length of the sub pixel.

Next, in a step (2) according to a first embodiment of the present invention, an electrode II is formed on the same plane as the electrode I or formed on the electrode I, and a plurality of electrode assembles including a first electrode connected to the electrode I and a second electrode that is spaced apart from the first electrode on the same plane as the first electrode and connected to the electrode II are formed.

The electrodes I and II may be the electrode assembly that is connected to the first and second electrodes on which the nano-scale LED is substantially mounted, and the electrode II is disposed on the same plane as the electrode I or disposed on the electrode I.

Figure 2:
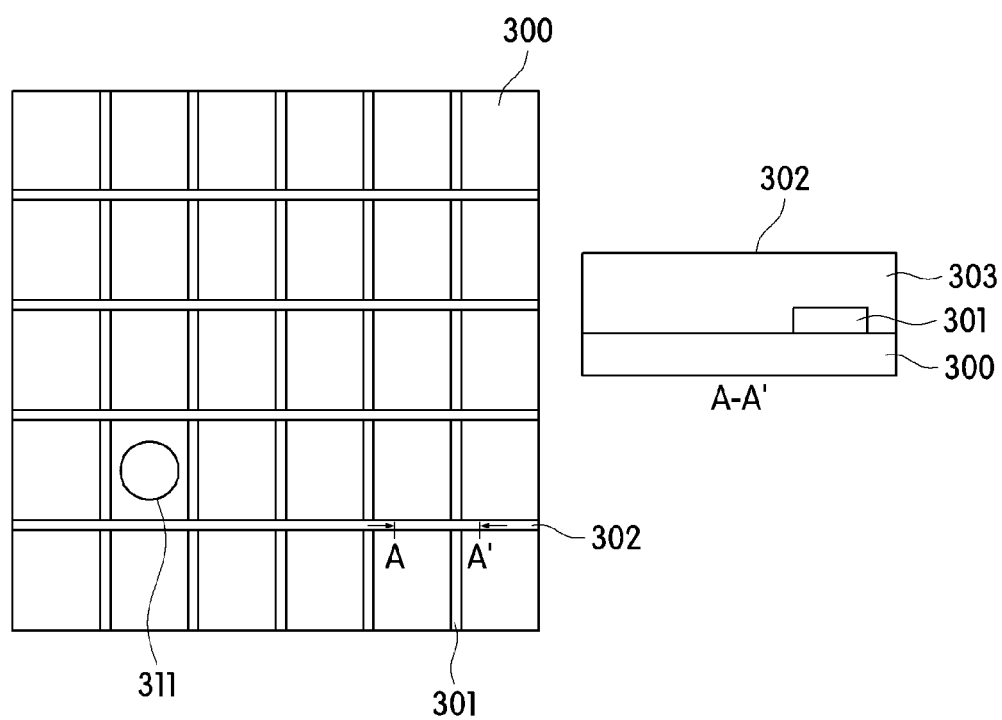
FIG. 2 is a plan and cross-sectional view of only an electrode I and an electrode II, which are provided in the display according to an embodiment of the present invention.

First, an electrode II (see reference numeral 108'c of FIG. 1R) may be formed on an electrode I (see reference numeral 103' of FIG. 1F). FIG. 2 is a plan and cross-sectional view of only an electrode I and an electrode II of the electrode assembly provided in the display according to an embodiment of the present invention. FIG. 2 is a cross-sectional view taken along line A-A'. Here, an electrode I 301 is formed on a substrate 300, and an electrode II 302 may be formed to be spaced apart from the substrate 300 and the electrode I 301. In this case, an insulation layer 303 for preventing both electrodes from being short-circuited may be disposed between the electrode I 301 and the electrode II 302.

Explaining the insulation layer 303 with reference to FIG. 1, the insulation layer 104 may be formed on the substrate 100 on which the electrode I 103' is formed as illustrated in FIG. 1G. The insulation layer 104 may prevent the electrical short-circuit from occurring by contact between the electrode I (see reference numeral 103' of FIG. 1F) and an electrode II (see reference numeral 108'c of FIG. 1R).

The insulation layer 104 may be formed of one selected from the group consisting of silicon dioxide ($SiO_2$), silicon nitride ($Si_3N_4$), aluminum oxide ($Al_2O_3$), and titanium oxide ($TiO_2$), more preferably, the silicon dioxide ($SiO_2$). However, the present invention is not limited to the above-described materials. For example, the insulation layer 104 may be transparent to minimize interference of light with respect to the nano-scale LED device.

The insulation layer 104 may be formed by using one of a plasma chemical deposition (PECVD) method, an E-beam deposition method, a thermal deposition method, and a sputtering deposition method, preferably, the PECVD method, but is not limited thereto. The formed insulation layer 104 may have a thickness of about 0.1 µm to about 50 µm, but is not limited thereto. Here, the thickness of the insulation layer 104 may be changed in consideration of a thickness of the display that is manufactured to a minimum thickness.

Figure 3:
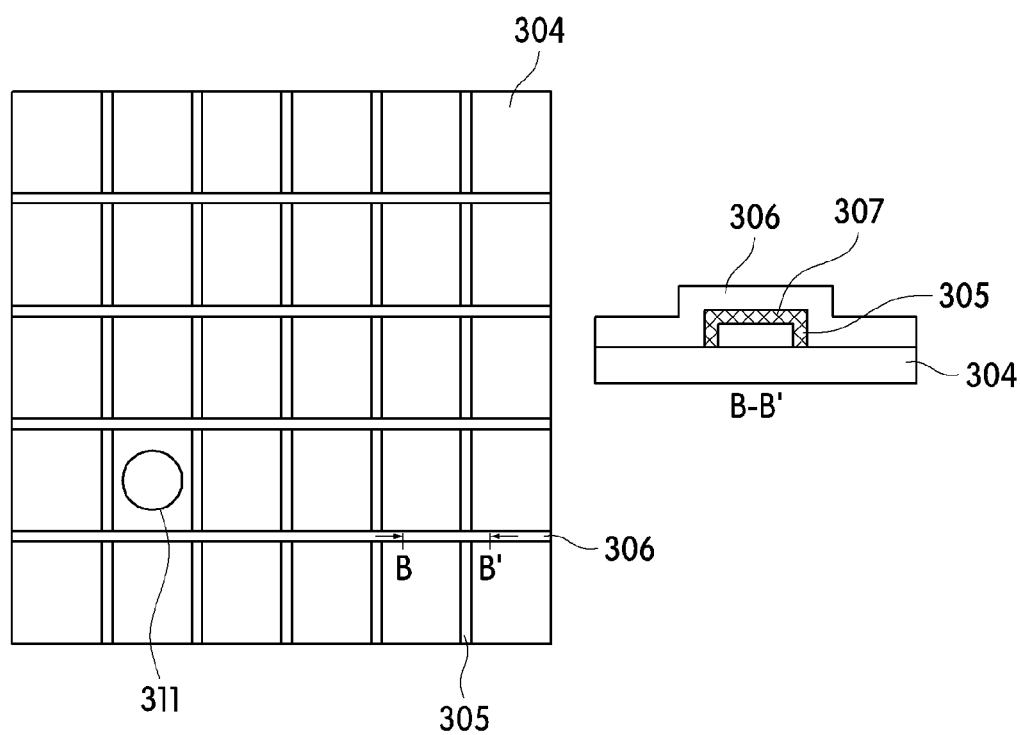
FIG. 3 is a plan and cross-sectional view of only the electrode I and the electrode II, which are provided in the display according to an embodiment of the present invention.

Also, the electrode II may be formed on the same plane as the electrode I. Particularly, FIG. 3 is a plan and cross-sectional view of only the electrodes I and II provided in the display according to an embodiment of the present invention. In the cross-sectional view taken along line B-B', the electrode I 305 may be formed on the substrate 304, and the electrode II 306 may be directly formed on the substrate 300 and the electrode I 301. In this case, the crossing portion may be electrically short-circuited. However, the insulation layer 307 may be formed between the electrodes crossing each other to solve the above-described limitation.

Hereinafter, a case in which an electrode II (see reference numeral 108c' of FIG. 1R) is formed an electrode I 103' will be described. A specific arrangement of the electrode I or II that is applicable of the present invention may vary according to purpose.

In the manufacturing of the electrode assembly according to the present invention, after the electrode I 103' is manufactured, and before the first and second electrodes in addition to the electrode II (see reference numeral 108c' of FIG. 1R) are manufactured, a connection electrode (see reference numeral 106' of FIG. 1M) for connecting the electrode I 103' to a first electrode (see reference numeral 108'a of FIG. 1R) may be manufactured first.

As illustrated in FIG. 1G, after the insulation layer 104 is formed on the substrate 100 in addition to the electrode I 103', a photo resist 105 may be applied again to an upper portion of the insulation layer 104 as illustrated in FIG. 1H. The applied photo resist 105 may have a thickness of about 0.1 µm to about 10 µm, but is not limited thereto.

Thereafter, as illustrated in FIG. 1I, a mask 107 disposed at a position corresponding to a connection electrode (see reference numeral 106' of FIG. 1M) and having a pattern corresponding to the connection electrode 106' may be placed on the photo resist 105 and then be exposed to UV light. An exposed portion of the photo resist 105 may be immersed into a general photo resist solvent and then removed (see FIG. 1J).

Thereafter, an etching process may be performed on the portion from which the photo resist is removed to remove the exposed insulation layer, thereby forming a space for manufacturing the connection electrode as illustrated in FIG. 1K The etching may be performed through wet etching or dry etching, preferably, the dry etching. A specific method for performing the etching process may be performed through a method that is well known in the ordinary skilled in the part. The dry etching may include at least one of plasma etching, sputter etching, reactive ion etching, and reactive ion bean etching. However, the specific etching method is not limited to the above-described materials. When the exposed insulation layer is removed through the etching, the electrode I 103' may be exposed from the substrate 100 as illustrated in FIG. 1K.

Thereafter, a connection electrode formation material 106 may be deposited on a photo resist 105' as illustrated in FIG. 1I. The connection electrode formation material 106 may be formed of a material that is equal to or different from that of the formation material 103 of the electrode 103'. The connection electrode formation material may be deposited by using one of a thermal deposition method, an E-beam deposition method, a sputtering deposition method, and a screen printing method. Preferably, the thermal deposition method is used, but it not limited thereto.

Next, when the photo resist 105' applied on the insulation layer 104 is removed by using one photo resist stripper of acetone, 1-methyl-2-pyrrolidone (NMP), and dimethyl sulfoxide (DMSO), an connection electrode 106' for connecting a first electrode 108'*a* that will be formed on a plane different from that of the electrode I 103' to the electrode I 103' may be formed on the electrode 103'.

Thereafter, to form an electrode II, a first electrode connected to the electrode I, and a second electrode disposed on the same plane as the first electrode and connected to the electrode II, as described above, after the connection electrode 106' is manufactured, as illustrated in FIG. 1N, the photo resist 107 may be applied again to the insulation layer 104. The photo resist 101 may be a photo resist that is generally used in the ordinary skilled in the art. The method for applying the photo resist 107 on the insulation layer 104 may include one of the spin coating method, the spray coating method, and the screen printing method. Preferably, the spin coating method is used, but is not limited thereto. A specific coating method may be performed by the method that is well-known in the ordinary skilled in the art. The photo resist 107 for coating may have a thickness of about 0.1 μm to about 10 μm. However, the coating photo resist 107 may have a thickness that is variable in consideration of a thickness of each of the electrode II, the first electrode, and the second electrode which will be deposited on the base substrate.

Thereafter, as illustrated in FIG. 1O, a mask having patterns 108*a* and 108*b* corresponding to the first and second electrodes and a pattern 108*c* corresponding to the electrode II on the same plane may be placed on the photo resist 107 and then exposed to the UV light. An exposed portion of the photo resistor 107 may be processed and removed by using a general photo resist solvent. As illustrated in FIG. 1P, the photo resist 107' from which the electrode formation portion is removed may be manufactured. Each of the patterns 108*a* and 108*b* corresponding to the first and second electrodes may have a width of about 100 nm to about 50 μm, and the pattern 108*c* may have a width of about 100 nm to about 50 μm, but are not limited thereto. The patterns of the electrodes may have the same width or widths different from each other.

Thereafter, the photo resist may be removed as illustrated in FIG. 1Q to deposit an electrode formation material 108 on the portion to which the insulation layer 104 is exposed and an upper portion of the remaining photo resist 107'. The electrode formation material 108 may be formed of at least metal material selected from the group consisting of aluminum, titanium, indium, gold, and silver or at least one transparent material selected from the group consisting of ITO (Indium Tin Oxide), ZnO:Al, and CNT-conductive polymer complex. If two kinds of electrode formation materials 108 are provided, the first electrode may have a structure in which at least two kinds of materials are stacked. More preferably, the electrode may be an electrode in which two kinds of materials, i.e., titanium/gold are stacked, but is not limited thereto. The electrode formation material 108 may be deposited by using one of a thermal deposition method, an E-beam deposition method, a sputtering deposition method, and a screen printing method. Preferably, the thermal deposition method is used, but it not limited thereto.

The electrode II and the first and second electrodes may be formed of the same material or materials different from each other.

Next, when the photo resist 105' applied on the insulation layer 104 is removed by using one photo resist stripper of acetone, 1-methyl-2-pyrrolidone (NMP), and dimethyl sulfoxide (DMSO), as illustrated in FIG. 1R, an electrode II 108'*c* and formed on the insulation layer 104, an electrode I 108'*a* connected to the connection electrode 106' formed on the electrode 103', a second electrode 108'*b* spaced apart form the first electrode 108'*a* on the same plane and connected to the electrode II 108'*c* may be formed.

However, the method for manufacturing the electrode assembly according to the present invention is not limited to the above-described manufacturing method. For example, at least one of the electrode II 108'*c*, the first electrode 108'*a*, and the second electrode 108'*b* may be formed at the same time, or one of them may be formed first.

Thus, a plurality of electrode assembles including the electrode I, the first electrode connected to the electrode I, the electrode II, and the second electrode spaced apart form the first electrode on the same plane and connected to the electrode II may be formed.

For example, the electrode II 108' c may have a width of about 100 nm to about 50 μm and a thickness of about 0.1 μm to about 10 μm. However, the present invention is not limited thereto. For example, the width and thickness may be changed according to a size of a sub pixel that will be described below. For example, the first electrode 108' a may have a width 108' c of about 100 nm to about 50 μm and a thickness of about 0.1 μm to about 10 μm. For example, the second electrode 108' b may have a width of about 100 nm to about 50 μm and a thickness of about 0.1 μm to about 10 μm. However, the present invention is not limited thereto. For example, the width and thickness may be changed according to a size of a nano-scale LED device that will be described below.

For example, the first and second electrodes may be spirally disposed or interdigitatedly disposed to be spaced apart from each other on the same plane.

Figure 4:
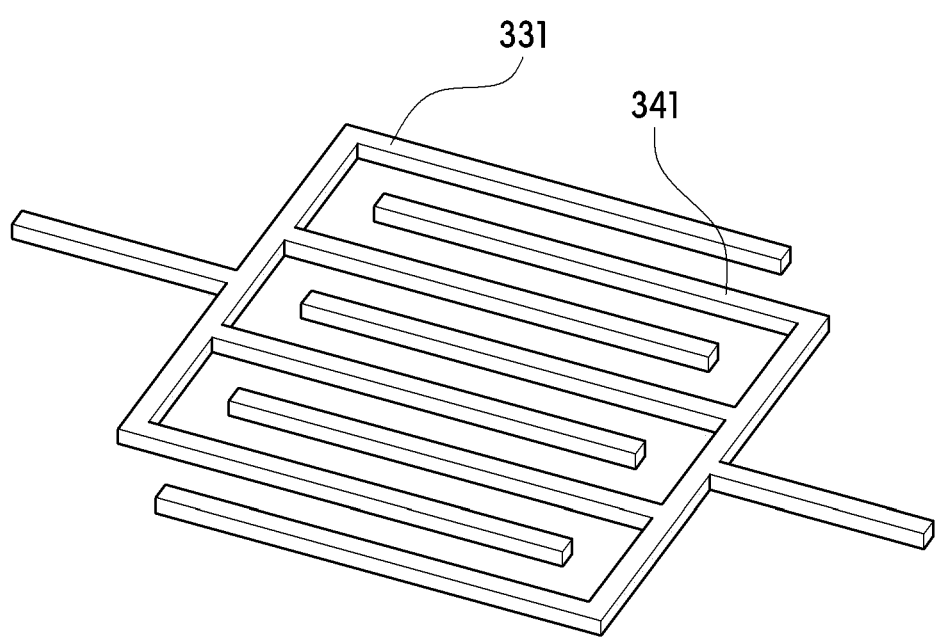
FIG. 4 is a perspective view of a first electrode and a second electrode according to an embodiment of the present invention.

FIG. 4 is a perspective view of the first electrode and the second electrode according to an embodiment of the present invention. First and second electrodes 331 and 341 may be interdigitatedly disposed to be spaced apart from each other on the same plane.

Figure 5:
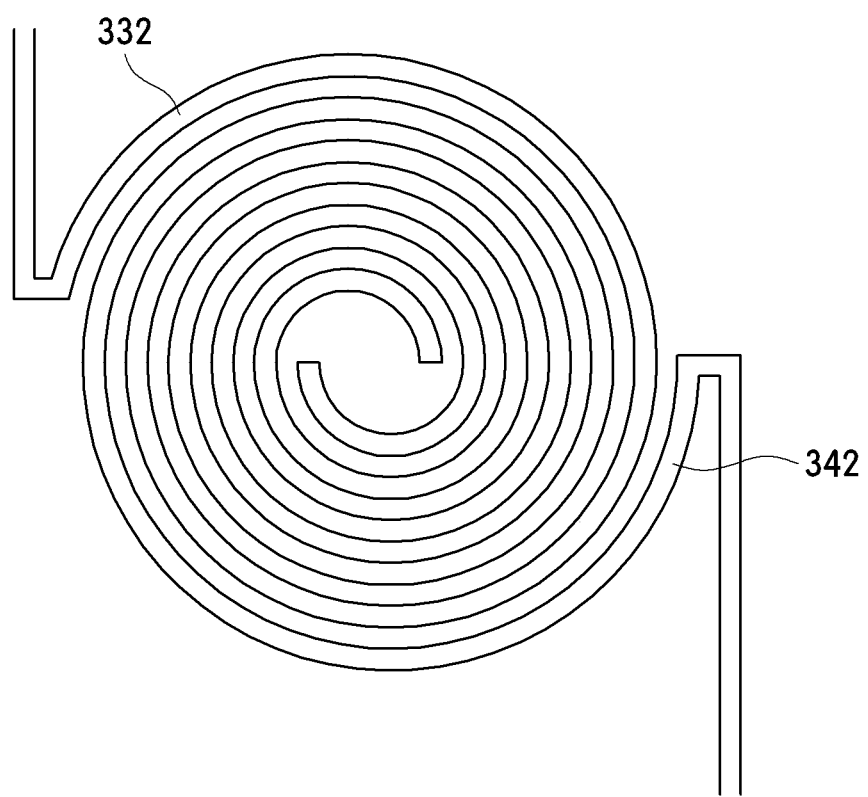
FIG. 5 is a plan view of the first electrode and the second electrode according to an embodiment of the present invention.

FIG. 5 is a plan view of the first electrode and the second electrode according to an embodiment of the present invention. First and second electrodes 332 and 342 may be spirally disposed to be spaced apart from each other on the same plane.

When the first and second electrodes corresponding to each other are interdigitally or spirally disposed, the nano-scale LEDs may be arranged to increase an operating area of a unit electrode that is independently operable, thereby increasing the number of nano-scale LEDs mounted on the unit electrode. Thus, since intensity of light emitted from the LED per the unit area increases, the display having high luminance may be realized.

FIGS. 4 and 5 are merely one embodiment, and thus the present invention is not limited thereto. For example, the two electrodes may be disposed in various shapes so as to be spaced a predetermined distance from each other.

Hereinafter, the shape in which the first and second electrodes are interdigitatedly disposed on the same plane will be described. However, the first and second electrodes may be directly disposed on the surface of the substrate or spaced apart from the surface of the substrate, and the first electrode may be disposed on the same plane as one of the electrodes I and II or a plane different form that of one of the electrodes I and II.

An embodiment of the present invention may further include a process of forming an insulation barrier surrounding a plurality of sub pixel sites formed on the plurality of electrode assembles on an upper portion of the substrate, wherein the insulation barrier includes the electrode assemblies between the steps (2) and (3).

First, the plurality of sub pixel sites formed on the plurality of electrode assembles will be described. The term "sub pixel" may denote the first and second electrodes on which the nano-scale LED devices are substantially mounted and the plurality of nano-scale LED devices mounted on the electrodes. A position of the sub pixel may be defined by the electrodes I and II. Here, the position may not include upper and lower spaces of the electrodes I and II and denote a space in which the plurality of nano-scale LEDs are substantially disposed.

In FIGS. 3 and 4, the sub pixel sites may be defined in spaces 310 and 311 that are partitioned by the electrodes I 301 and 305 and the electrodes II 302 and 306 and may be directly formed on the surfaces of the substrates 300 and 304 or indirectly formed to be spaced apart from upper portions of the substrates 300 and 304. Also, the sub pixel sites may be formed on the same plane as or a plane different from that of at least one of the electrodes I 301 and 305 or electrodes II 302 and 306.

As described above, in a step (3) that will be described below, a solution containing the nano-scale LED devices may be injected into the sub pixel sites. Due to fluidity of the solution, the nano-scale LED devices may be spread to move to edges or the outside of the sub pixel sites. Thus, a phenomenon in which the nano-scale LED devices may not be concentratedly disposed at the desired sub pixel sites may occur. The insulation barrier may be provided to solve the above-described limitation. The insulation barrier may prevent the solution containing the nano-scale LED devices from being spread to a site except for the sub pixel sites on which the nano-scales LED devices are mounted and/or the edges of the sub pixel sites so that the nano-scale LED devices are concentratedly disposed in the sub pixel sites and/or at a center of each of the sub pixel sites.

Although the insulation barrier is manufactured through a manufacturing process that will be described below, the present invention is not limited to the method for the insulation barrier.

Figure 6:
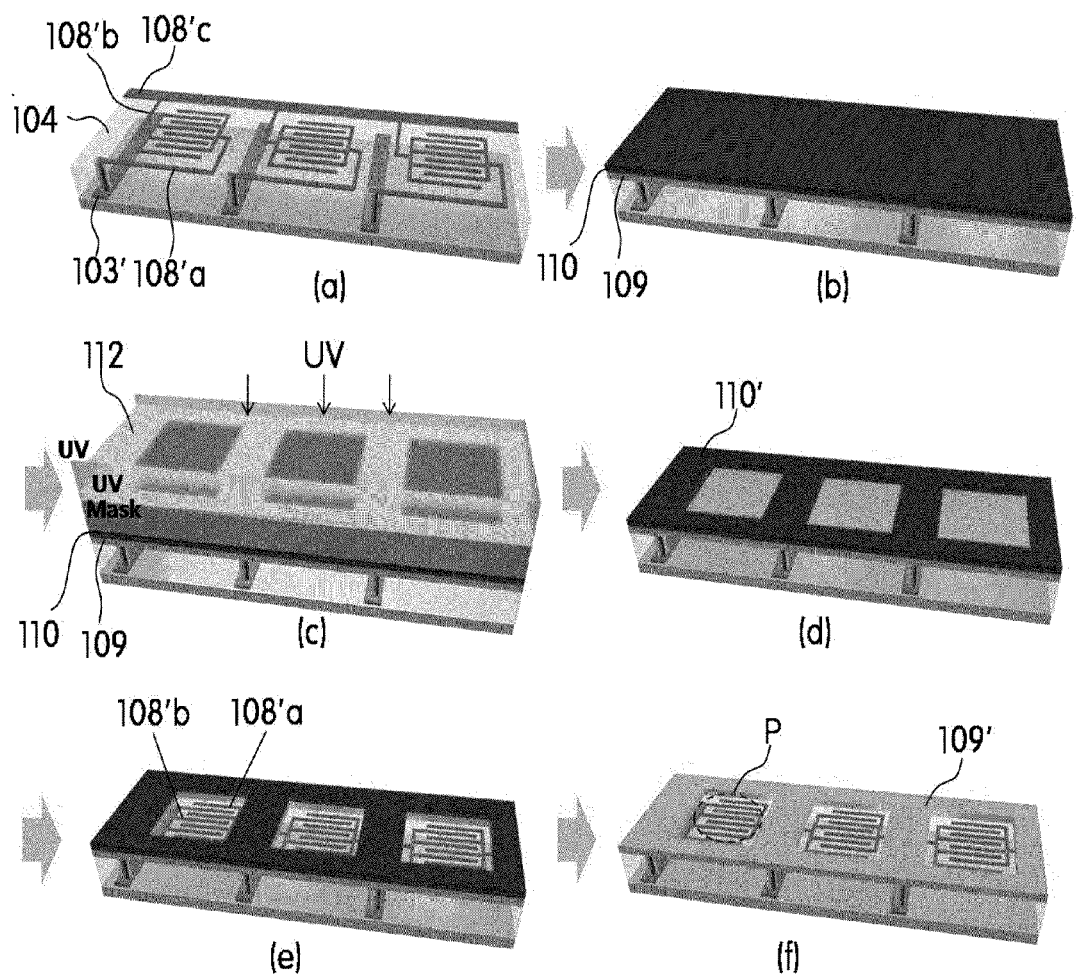
FIG. 6 is a schematic view illustrating a process of manufacturing an insulation barrier according to an embodiment of the present invention.

FIG. 6 is a schematic view illustrating a process of manufacturing the insulation barrier according to an embodiment of the present invention. As described in FIG. 1R, after the electrode assembly is manufactured, the insulation barrier may be manufactured.

First, as illustrated in FIG. 6A, an insulation layer 109 may be formed as illustrated in FIG. 6B on the electrode assembly including the substrate 100, the electrode I 103' formed on the substrate 100, an insulation layer 104 connected to the electrode I 103', formed on the substrate 100 in addition to the electrode 103', the first electrode formed on the insulation layer 104, the electrode II 108'c formed on the insulation layer 104, and the second electrode 108'b connected to the electrode II 108'c, formed on the insulation layer 104, and spaced apart from the first electrode 108'a on the same plane as the first electrode 108'a.

The insulation layer 109 may be a layer for forming the insulation barrier after following processes are performed. The insulation layer 109 may be formed of an insulation material that is generally used in the ordinary skilled in the part, preferably, one of inorganic materials such as silicon nitride ($Si_3N_4$), silicon dioxide ($SiO_2$), aluminum oxide ($Al_2O_3$), hafnium oxide ($HfO_2$), yttrium oxide ($Y_2O_3$), and titanium oxide ($TiO_2$) and various transparent polymer insulation materials. A method of forming the insulation layer 109 may use one of a chemical vapor deposition method, an atomic layer deposition method, a vacuum deposition method, an E-beam deposition method, and a spin coating method, preferably, the chemical vapor deposition method, but is not limited thereto. Also, a method for applying the polymer insulation layer may use one of a spin coating method, a spray coating method, and a screen printing method, preferably, the spin coating method, but is not limited thereto. A specific coating method may be performed by the method that is well-known in the ordinary skilled in the art. The applied insulation layer 109 may have a thickness that corresponds to a half or more of a diameter of the nano-scale LED device so that the nano-scale LED device does not overflow and have an influence on the following processes. Generally, the insulation layer 104 may have a thickness of about 0.1 μm to about 100 μm, which does not have an influence on the following processes, preferably, about 0.3 μm to about 10 μm. If the above-described range is not satisfied, it may be difficult to manufacture the display because the insulation layer has an influence on the following processes. If the insulation layer has a thickness that is too thinner than a diameter of the nano-scale LED device, the prevention in spreading of the nano-scale LED device through the insulation barrier may be insufficient to cause the phenomenon in which the solution containing the nano-scale LED device may overflow to the outside of the insulation barrier.

Thereafter, a photo resist (PR) 109 may be applied on the insulation layer 110. The photo resist 101 may be a photo resist that is generally used in the ordinary skilled in the art. The method for applying the photo resist 110 on the insulation layer 109 may include one of the spin coating method, the spray coating method, and the screen printing method. Preferably, the spin coating method is used, but is not limited thereto. A specific coating method may be performed by the method that is well-known in the ordinary skilled in the art. The applied photo resist 110 may have a thickness that is slightly thicker than that of the insulation layer applied to a mask that is used for an etching process. Thus, the photo resist 110 may have a thickness of about 0.1 μm to about 20 μm. However, the photo resist 110 for coating may have a thickness that is variable in consideration of a purpose thereof.

After the photo resist 109 is formed on the insulation layer 110 as described above, a mask 111 having a shape corresponding to a horizontal cross-section of the insulation barrier is placed on the photo resist 110 as illustrated in FIG. 6C and then be exposed to UV rays that are irradiated from an upper side of the mask 110.

Thereafter, the exposed photo resist may be immersed into a general photo resist solvent and then removed. Thus, as illustrated in FIG. 6D, a photo resist 110' from which the exposed portion of the photo resist layer, which corresponds to the sub pixel site is removed may be manufactured.

Next, the insulation layer from which the photo resist layer is removed and exposed may be etched and removed. The etching may be performed through wet etching or dry etching, preferably, the dry etching. A specific method for performing the etching process may be performed through a method that is well known in the ordinary skilled in the part. The dry etching may include at least one of plasma etching, sputter etching, reactive ion etching, and reactive ion bean etching. However, the specific etching method is not limited to the above-described materials. When the exposed insulation layer is removed through the etching, the first and second electrodes 108'a and 108'b provided in the sub pixel site on which the nano-scale LED device is mounted may be exposed as illustrated in FIG. 6E.

Next, as illustrated in FIG. 6F, when the applied photo resist 110' is removed by using one photo resist stripper of acetone, 1-methyl-2-pyrrolidone (NMP), and dimethyl sulfoxide (DMSO), an insulation barrier 109' surrounding the sub pixel site (see reference symbol P of FIG. 6) on which the nano-scale LED device is substantially mounted may be manufactured.

Next, in the step (3) according to the first embodiment of the present invention, a process of injecting a solution containing a plurality of nano-scale LED devices into a plurality of sub pixel sites formed on the plurality of electrode assembles is performed.

Figure 7:
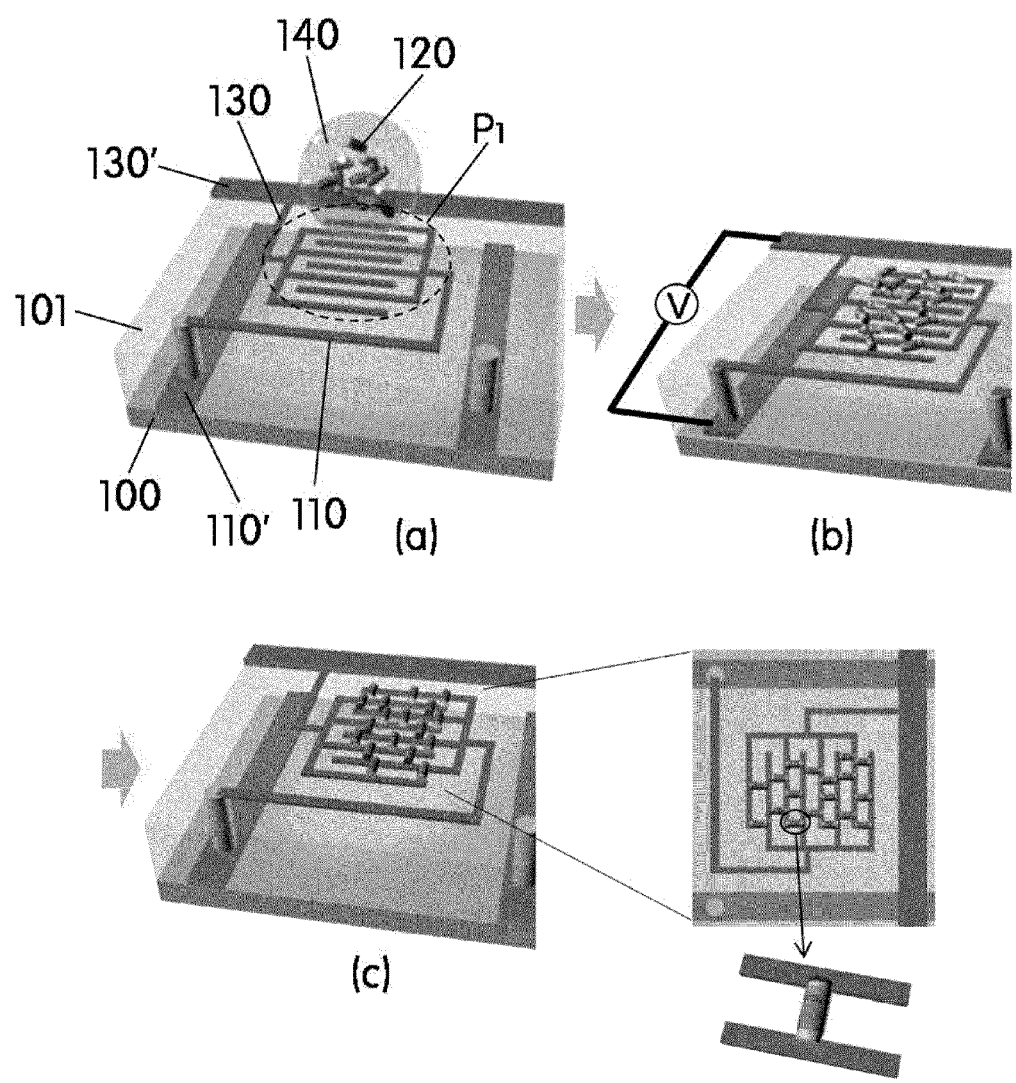
FIG. 7 is a schematic view illustrating a process of manufacturing sub pixels according to an embodiment of the present invention.
Figure 8:
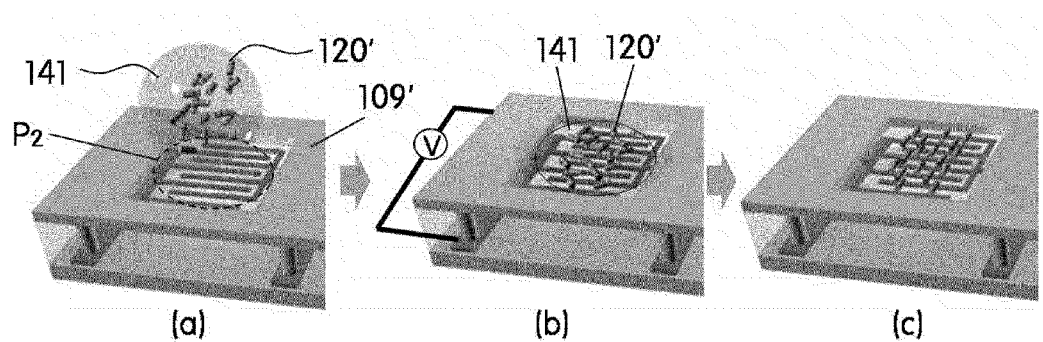
FIG. 8 is a schematic view illustrating the process of manufacturing the sub pixels according to an embodiment of the present invention.

FIGS. 7 and 8 is a schematic view illustrating a process of manufacturing sub pixels according to an embodiment of the present invention. As illustrated in FIG. 7A, solution 120 and 140 containing plurality of nano-scale LED devices 120 may be injected into a sub pixel site P1 formed on the electrode assembly including an electrode I 110' formed on the substrate 100, a first electrode 110 connected to the electrode I 110' and formed on the substrate 100 in addition to the electrode I 110', an electrode II 130' formed on the insulation layer 110, and a second electrode 130 connected to the electrode II 130', formed on the insulation layer, and spaced apart from the first electrode 110 on the same plane as the first electrode 110. Also, as illustrated in FIG. 8A, solutions 120' and 141 containing a plurality of nano-scale LED devices 120' may be injected into a sub pixel site P2 surrounded by an insulation barrier 109'. Also, when the solutions 120' and 141 containing the plurality of nano-scale LED devices 120' are injected into the sub pixel site P2 surrounded by the insulation barrier 109', the nano-scale LED devices may be relatively easily disposed on the center, but the edge of the sub pixel site when compared to a case in which the solution containing the plurality of nano-scale LED device is injected into the sub pixel site P1 in which the insulation barrier is not provided as illustrated in FIG. 7A.

Hereafter, the solution (see reference numerals 120 and 140 of FIGS. 7 and 120' and 141 of FIG. 8) containing a plurality of nano-scale LED devices (see reference numeral 120 of FIG. 7 and 120' of FIG. 8) will be described. However, following descriptions will be described with reference to FIG. 7.

The solutions 120 and 140 containing the plurality of nano-scales LED devices 120 may be manufactured by mixing a plurality of nano-scale LED devices 120 with a solvent 140. The solution may have an ink or paste phase. For example, the solvent 140 may be one selected from the group consisting of acetone, water, alcohol, and toluene, more preferably, acetone. However, the present invention is not limited to the above-described kinds of solvent 140. If the solvent 140 is well vaporized without having a physical and chemical influence on the nano-scale LED devices 120, the solvent 140 is not limited in kind.

The nano-scale LED devices 120 may be contained in about 0.001 weight parts to about 100 weight parts with respect to 100 weight parts of the solvent 140. If the nano-scale LED devices are contained in about 0.001 weight part or less, the number of nano-scale LED devices connected to the electrode may be low, and thus, it may be difficult to exert a normally function of the sub pixels. To solve this limitation, the solution has to be added several times. On the other hand, if the nano-scale LED devices are contained in about 100 weight part or more, it may be difficult to align the nano-scale LED devices without interfering.

The nano-scale LED device 129 will be described. The nano-scale LED device 120 that is capable of being used in the present invention may be a nano-scale LED device that is used for a general display, but is not limited thereto. For example, the nano-scale LED device 120 may have a length of about 100 nm to about 10 μm, preferably, about 500 nm to about 5 μm. If the nano-scale LED device has a length of about 100 nm or less, it may be difficult to manufacture an LED device having high efficiency. On the other hand, if the nano-scale LED device has a length of about 10 μm or more, light efficiency of the LED device may be deteriorated. The nano-scale LED device may have various shapes such as a cylindrical shape and a rectangular parallelepiped shape, preferably, the cylindrical shape, but is not limited thereto.

Hereinafter, in the description of the nano-scale LED device, the terms "above", "below", "left", "right", "upper", and "lower" may denote vertical upper and lower directions with respect to each layer included in the nano-scale LED device.

The nano-scale LED device includes a first electrode layer; a first conductive type semiconductor layer disposed on the first electrode layer; an active layer disposed on the first conductive type semiconductor layer; a second conductive type semiconductor layer disposed on the active layer; and a second electrode layer disposed on the second conductive type semiconductor layer.

Figure 9:
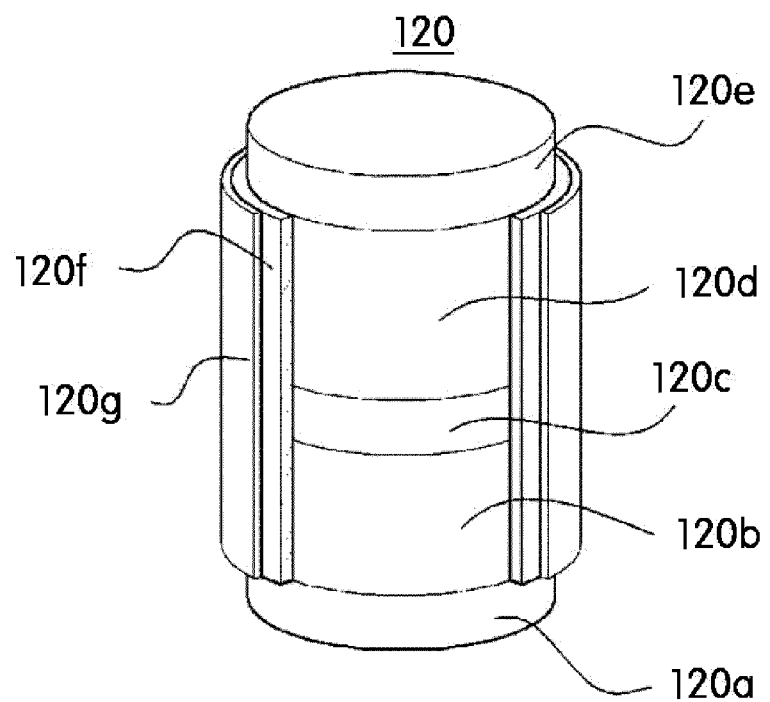
FIG. 9 is a perspective view of a nano-scale LED device according to an embodiment of the present invention.

Particularly, FIG. 9 is a perspective view of a nano-scale LED device according to an embodiment of the present invention. Here, the nano-scale LED device includes an active layer 120c disposed on a first conductive type semiconductor layer 120b disposed on a first electrode layer 120a, a second conductive type semiconductor layer 120d disposed on the active layer 120c, and a second electrode layer 120e disposed on the second conductive type semiconductor layer 120d.

First, the first electrode layer 120a will be described.

The first electrode 120a may be formed of metal or metal oxide that is used for an electrode of a general LED device. For example, the first electrode 11 may be formed of one or mixture of chrome (Cr), titanium (Ti), aluminum (Al), gold (Au), nickel (Ni), ITO, and oxide or alloy thereof, but is not limited thereto. For example, the first electrode layer may have a thickness of about 1 nm to about 100 nm, but is not limited thereto. If the first electrode layer is provided, the first semiconductor layer and the electrode assembly may be connected to each other at a relatively low temperature when compared to a required temperature in a process of forming a metal ohmic layer at a connection portion between the first semiconductor layer and the electrode assembly.

Next, the first conductive type semiconductor layer 120b disposed on the first electrode layer 120a will be described. For example, the first conductive type semiconductor layer 120b may include an N-type semiconductor layer. When the nano-scale LED device is a blue light emitting device, the n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN. Also, the first conductive type semiconductor layer 120b may be doped with a first conductive type dopant (e.g., Si, Ge, or Sn). For example, the first conductive type semiconductor layer 120b may have a thickness of about 500 nm to about 5 μm, but is not limited thereto. The light color of the nano-scale LED is not limited to the blue color. If the light color is different, different kinds of III-V group semiconductor materials may be used for the n-type semiconductor layer.

Next, the active layer 120c disposed on the first conductive type semiconductor layer 120b will be described. If the nano-scale LED device is a blue light emitting device, the active layer 120*c* may be disposed on the first conductive type semiconductor layer 120*b* and have a single or multi quantum well (MQW) structure. A clad layer (not shown) which is doped with a conductive dopant may be disposed on and/or under the active layer 120. The clad layer doped with the conductive dopant may be realized as an AlGaN layer or an InAlGaN layer. In addition, materials such as AlGaN and AlInGaN may be used for the active layer 120*c*. When electric fields are applied to the active layer 120*c*, light may be generated due to coupling of electron-hole pairs. For example, the active layer may have a thickness of about 10 nm to about 200 nm, but is not limited thereto. The active layer may be disposed at various positions according to kinds of LEDs. The light color of the nano-scale LED is not limited to the blue color. If the light color is different, different kinds of III-V group semiconductor materials may be used for the active layer.

Next, the second conductive type semiconductor layer 120*d* disposed on the active layer 120*c* will be described. When the nano-scale LED device is a blue light emitting device, the second conductive type semiconductor layer 120*d* is disposed on the active layer 120*c*, and the second conductive type semiconductor layer 120*d* may be realized as at least one p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, and InN. Also, the second conductive type semiconductor layer 120*d* may be doped with a second conductive type dopant (e.g., Mg). Here, a light emitting structure may include the first conductive type semiconductor layer 120*b*, the active layer 120*c*, and the second conductive type semiconductor layer 120*d* as minimum components. Also, the light emitting structure may further include the other phosphor layer, active layer, semiconductor layer, and/or electrode layer above/below each layer. For example, the second conductive type semiconductor layer 120*d* may have a thickness of about 50 nm to about 500 nm, but is not limited thereto. The light color of the nano-scale LED is not limited to the blue color. If the light color is different, different kinds of III-V group semiconductor materials may be used for the p-type semiconductor layer.

Next, the second electrode layer 120*e* disposed on the second conductive type semiconductor layer 120*d* will be described.

The second electrode 120*e* may be formed of metal or metal oxide that is used for an electrode of a general LED device. For example, the first electrode 11 may be formed of one or mixture of chrome (Cr), titanium (Ti), aluminum (Al), gold (Au), nickel (Ni), ITO, and oxide or alloy thereof, but is not limited thereto. For example, the second electrode layer may have a thickness of about 1 nm to about 100 nm, but is not limited thereto. If the second electrode layer is provided, the second semiconductor layer and the electrode assembly may be connected to each other at a relatively low temperature when compared to a required temperature in a process of forming a metal ohmic layer at a connection portion between the second semiconductor layer and the electrode assembly.

The nano-scale LED device of the display according to the present invention includes an insulation film 120*f* covering an outer surface including a portion of the active layer 120*c* to prevent the active layer 120*c* of the nano-scale LED device and the electrode assembly of the display from contacting each other to cause the electrical short-circuit.

Also, in FIG. 9, the insulation film 120*f* may be applied to the outer surface of the nano-scale LED device including the active layer 120*c*. Preferably, the insulation film 120*f* may be applied to at least one of the first and second semiconductor layers 120*b* and 120*c* to prevent durability of the nano-scale LED device from being deteriorated due to the damage of the outer surface of the semiconductor layer.

The insulation film 120*f* may prevent the electrical short-circuit occurring when the active layer 120*c* of the nano-scale LED device contacts the electrode from occurring. Also, the insulation layer 120*f* may protect the outer surface in addition to the active layer 120*c* of the nano-scale LED device to prevent the surface defects of the active layer 120*c* from occurring, thereby to prevent light emitting efficiency from deteriorated.

If each of the nano-scale LED devices is disposed and connected one by one between two electrodes different from each other, the electrical short-circuit occurring due to the contact between the active layer and the electrodes may be prevented. However, it may be difficult to mount the nano-scale LED device having the nano unit one by one to the electrode. Thus, when power is applied to self-align the nano-scale LED devices between the two electrodes different from each other, the nano-scale LED device may be changed in position through movement and alignment between the two electrodes different from each other. In this process, the active layer 120*d* of the nano-scale LED device may contact the electrode assembly to frequently cause the electrical short-circuit.

If the nano-scale LED device stands up on the electrode to realize the display, the electrical short-circuit occurring due to the contact between the active layer and the electrode assembly may be prevented. That is, when the nano-scale LED device does not stand up on the electrode, but lies on the electrode, the contact between the active layer and the electrode assembly may occur. In this case, it may be difficult to connect the nano-scale LED device between the two electrodes different from each other, and also, the electrical short-circuit may occur.

Figure 10:
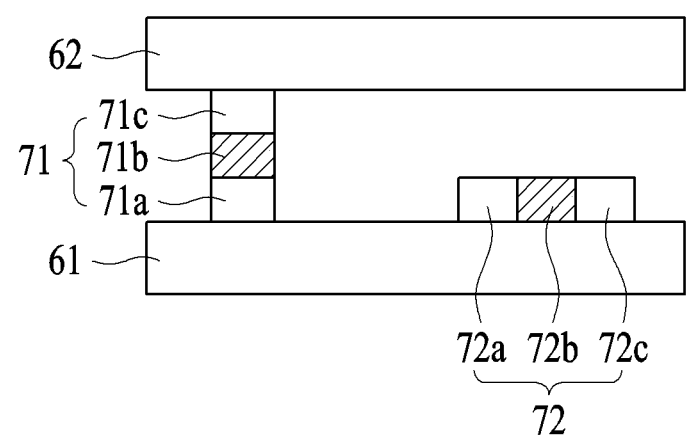
FIG. 10 is a vertical cross-sectional view of an LED device and an electrode provided in a display including a nano-scale LED device according to a related art.

FIG. 10 is a vertical cross-sectional view of the LED device and the electrode of the display including the nano-scale LED device according to the related art. Here, it is seen that a first semiconductor layer 71*a* of a first nano-scale LED device 71 is connected to a first electrode 61, a second semiconductor layer 71*c* is connected to a second electrode 62, and the first nano-scale LED device 71 stands up and is connected between two electrodes 61 and 62. If the first nano-scale LED device 71 is connected to both of the two electrodes in the electrode assembly of FIG. 10, an active layer 71*b* of the device may not contact one of the two electrodes 61 and 62 to prevent the electrical short-circuit due to the contact between the active layer 71*b* and the two electrodes 61 and 62 from occurring.

On the other hand, the second nano-scale LED device 72 may be laid on the first electrode 61 in FIG. 10. In this case, the active layer 72*b* of the second nano-scale LED device 72 may contact the first electrode 61. Here, the second nano-scale LED device 72 may not be connected to the first and second electrodes 61 and 62. However, the electrical short-circuit may not occur. Thus, if the insulation film is applied to the outer surfaces of the first semiconductor layer 71*a*, the active layer 71*b*, and the second semiconductor layer 71*c* of the first nano-scale LED device 71 contained in the electrode assembly as illustrated in FIG. 7, the insulation film may have only an object and effect of the reduction of the light emitting efficiency by preventing the outer surface of the nano-scale LED device from being damaged.

However, unlike the display including the nano-scale LED of FIG. 10 according to the related art, according to the present invention, the two electrodes different from each other may be disposed to be spaced apart from each other (see FIG. 4). Also, since the nano-scale LED device is connected in the lay state parallel to the same plane as the two electrodes, the electrical short-circuit occurring due to the contact between the active layer of the nano-scale LED device and the electrodes may occur even though the electrical short-circuit does not occur in the display including the nano-scale LED according to the related art. Thus, the prevent the above-described short-circuit, it may be necessary to form the insulation film covering the outer surface of a portion of at least the active layer on the outer surface of the nano-scale LED device.

Furthermore, like the nano-scale LED device of the display according to the present invention, the active layer may be necessarily exposed to the outside in the nano-scale LED device having the structure in which the first semiconductor layer, the active layer, the second semiconductor layer are successively and vertically arranged. Also, in the LED device having the above-described structure, the active layer may not be disposed at only a center in a longitudinal direction of the device, but be disposed toward a specific semiconductor layer to increase possibility of the contact between the electrode and the active layer. Thus, the insulation film may electrically connect the device to the two electrode different from each other regardless of the position of the active layer to achieve the object of the present invention. As a result, the insulation film may be necessary.

Figure 11:
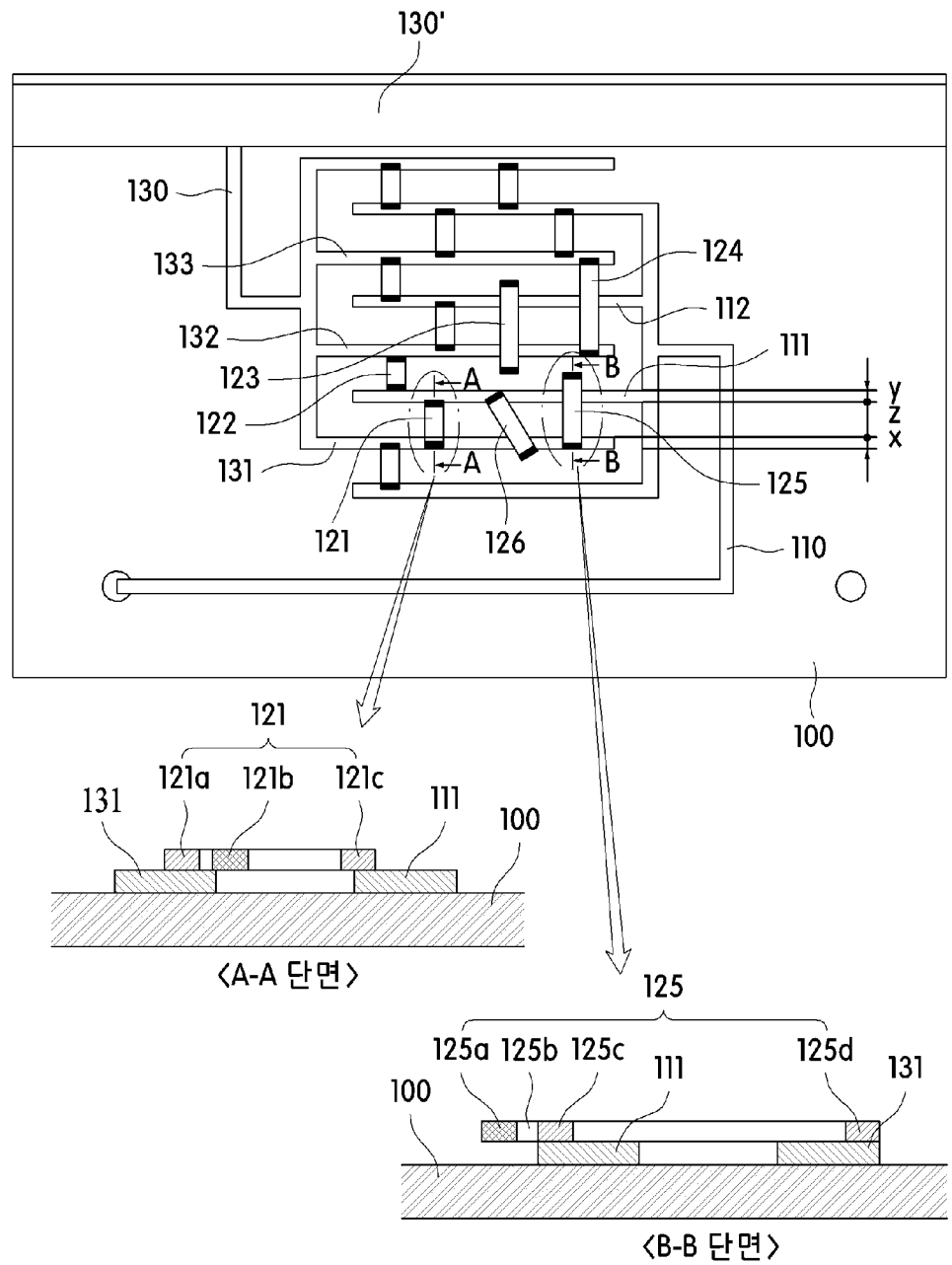
FIG. 11 is a plan and vertical cross-sectional view of the nano-scale LED device connected to the first and second electrodes provided in the sub pixel of the display according to an embodiment of the present invention.

FIG. 11 is a plan and vertical cross-sectional view of the nano-scale LED device connected to the first and second electrodes provided in the sub pixel of the display according to an embodiment of the present invention. Particularly, as illustrated in the cross-sectional view taken along line A-A in FIG. 11, an active layer 121b of first nano-scale LED devices 121a, 121b, and 121c may not be disposed at a central portion of the nano-scale LED device 121, but be disposed toward a left side. In this case, possibility of contact between a portion of the active layer 121b and an electrode may increase to cause the electrical short-circuit. This may cause production of the display having defective sub pixel. To solve the above-described limitation, an outer surface of the nano-scale LED device of the present invention in addition to a portion of the active layer may be coated with an insulation film. Thus, even though the active layer 121b is disposed between the two electrodes, like the first nano-scale LED device 121 of FIG. 11, the short-circuit may be prevented due to the insulation film.

The insulation film (see reference numeral 120f of FIG. 9) may be formed of one of silicon nitride ($Si_3N_4$), aluminum oxide ($Al_2O_3$), hafnium oxide ($HfO_2$), yttrium oxide ($Y_2O_3$), and titanium oxide ($TiO_2$). For example, the insulation film 30 may be formed of a transparent material including the above-described component, but is not limited thereto. In case of the transparent insulation film, the insulation film (see reference numeral 120f of FIG. 9) may have its original function and the coating function to minimize the reduction of the light emitting efficiency that may rarely occur.

According to an embodiment of the present invention, the insulation film (see reference numeral 120f of FIG. 9) may not be applied to at least one of the first and second electrode layers (see reference numerals 120a and 120e of FIG. 9) of the nano-scale LED device, preferably, may not be applied to all of the first and second layers 120a and 120e. Here, the two electrode layers 120a and 120e have to be electrically connected to the electrodes different from each other, respectively. When the insulation film 120f is applied to the two electrodes 120a and 120e, the electrical connection therebetween may be interrupted to reduce intensity of light emitted from the LED device or may not occur so that light is not emitted. However, when the two electrode layers 120a and 120e of the nano-scale LED device are electrically connected to the electrodes different from each other, there is no problem in emission of the LED device, and thus, the insulation film 120f may be applied to the rest electrode layers except for ends of the two electrode layers 120a and 120e of the nano-scale LED device.

According to an embodiment of the present invention, the nano-scale LED device may further include a hydrophobic film (see reference numeral 120g of FIG. 9) on the insulation film (see reference numeral 120f of FIG. 9). The hydrophobic film 120g may provide a hydrophobic property on the surface of the nano-scale LED device to prevent the LED devices from being aggregated. When the nano-scale LED device is mixed with a solvent, the aggregation between the nano-scale LED devices may be minimized to remove the reduction in characteristic of the independent nano-scale LED device. Also, when power is applied to the electrode assembly, the nano-scale LED devices may be more easily aligned in position.

The hydrophobic film (see reference numeral 120g of FIG. 9) may be disposed on the insulation film (see reference numeral 120f of FIG. 9). In this case, the hydrophobic film is not limited, if the hydrophobic film is disposed on the insulation film to prevent the nano-scale LED devices from being aggregated. The hydrophobic film may be formed of one or mixture of self-assembled monolayers (SAMs) such as octadecyltrichlorosilane, (OTS), fluoroalkyltrichlorosilane, and (perfluoroalkyltriethoxysilane) and fluoropolymer such as Teflon and cytop, but is not limited thereto.

The nano-scale LED device of the display according to the present invention may have a length that satisfies following relation expression 1 to electrically connect the nano-scale LED device to the two electrodes different from each other. If the nano-scale LED device and the two electrodes are not electrically connected to each other, even though power is applied to the electrode assembly, the nano-scale LED device may not emit light because the nano-scale LED device and the two electrodes are not electrically connected to each other.

[Relation Expression 1]

The relation expression 1 may be expressed as follows: $0.5Z \leq H < X+Y+2Z$. Here, the relation expression 1 may satisfy a following condition: $Z \leq H < X+Y+2Z$, more preferably, a relation expression 2 may satisfy a following condition: $Z \leq H \leq X+Y+Z$ (where 100 nm<$X \leq 10$ μm, 100 nm<$Y \leq 10$ μm, 100 nm<$Z \leq 10$ μm). The reference symbol X denotes a length of a width of the first electrode included in the electrode assembly, and the reference symbol Y denotes a length of a width of the second electrode. The reference symbol Z denotes a distance between the first electrode and the second electrode adjacent to the first electrode, and the reference symbol H denotes a length of the nano-scale LED device. Here, if each of the first and second electrodes is provided in plurality, the distances Z between the two electrodes may be equal to or different from each other.

A portion of the nano-scale LED device, which is electrically connected to the two electrode different from each other may be at least one layer (or one of the second conductive type semiconductor layer and the second electrode layer) of the first electrode layer and the first conductive type semiconductor layer of the nano-scale LED device.

If the nano-scale LED device has a length that is significantly less than the distance between the two electrodes different from each other, it may be difficult to connect the nano-scale LED device to both of the two electrodes. Thus, the nano-scale LED device may be a nano-scale LED device having a length H that satisfies a following condition in the relation expression 1: $0.5Z \le H$. If the nano-scale LED device has the length H that does not satisfy the condition $0.5Z \le H$ in the relation expression 1, the nano-scale LED device may not be electrically connected to the first and second electrodes, but be electrically connected to only one of the first and second electrodes. In detail, as illustrated in FIG. 11, since the second nano-scale LED device 122 may be inserted and electrically connected between the first and second electrodes 111 and 132, the nano-scale LED device according to the present invention may be an LED device that satisfies a condition $Z \le H$ in the relation expression 2.

When the nano-scale LED device has a length H that increases in consideration of the width X of the first electrode, the width Y of the second electrode, and the distance Z between the first and second electrodes, a portion of the third nano-scale LED device 123 of FIG. 11 except for both ends thereof may be independently connected to each of the first and second electrodes 112 and 132. If the third nano-scale LED device 123 is connected as described above, when an outer surface of the nano-scale LED device is not coated with the insulation film, the electrical short-circuit between the electrode and the nano-scale LED device 123 may occur. However, the nano-scale LED device according to the present invention includes the insulation film covering the outer surface in addition to the active layer. Thus, like the third nano-scale LED device 123 of FIG. 11, even though the portion of the third nano-scale LED device 123 except for both ends thereof is connected to the electrode, the third nano-scale LED device 123 may be electrically connected to the electrode without causing the electrical short-circuit.

However, since the nano-scale LED device has the length H that increases in consideration of the width X of the first electrode, the width Y of the second electrode, and the distance Z between the first and second electrodes, if a condition of $H < X+Y+2Z$ in the relation expression 1 is not satisfied, the nano-scale LED device that is not electrically connected may be provided in the sub pixel. In detail, a fourth nano-scale LED device 124 of FIG. 11 may be connected to the two electrodes 132 and 133 and one first electrode 112 at the same time. In this case, the nano-scale LED device may have a length that does not satisfy a following condition in the relation expression 1: $H < X+Y+2Z$. In this case, the active layer of the nano-scale LED device according to the present invention is coated with the insulation film, the electrical short-circuit due to the contact between the active layer and the first electrode 112 may be solved. However, since both ends of the nano-scale LED device 124 are connected to the two second electrodes 132 and 133, the electrical connection therebetween may not be substantially performed. Thus, the fourth nano-scale LED device 124 of FIG. 11 may not emit light even though power is applied to the electrode assembly.

Thus, the nano-scale LED device may have a length H that satisfies a following condition in the relation expression 1: $H < X+Y+2Z$. However, if the active layer of the nano-scale LED device is disposed toward the conductive type semiconductor layer (see reference numeral 156b of FIG. 11), and the portion of the nano-scale LED device connected to the electrode is the active layer that is coated with the insulation film, but the electrode layer and/or the conductive type semiconductor layer, although the electrical short-circuit does not occur by the insulation film, the nano-scale LED device may not be electrically connected to the electrode assembly.

Particularly, in FIG. 11, a fifth nano-scale LED device 125 may be connected to both of the first and second electrodes 111 and 131. However, in the cross-sectional view taken along line B-B in FIG. 11, it is seen that a portion of a fifth nano-scale LED device 125 connected to the first electrode 111 is a portion of the active layer 125c coated with the insulation film, and the first electrode layer 125a and the first conductive type semiconductor layer 125b is not connected to the first electrode 111. Since the fifth nano-scale LED device is coated with the insulation film on the outer surface of the active layer 125c, although the electrical short-circuit does not occur, the first electrode layer 125a and the first conductive type semiconductor layer 125b may not be connected to the first electrode 111. Thus, the nano-scale LED device 125 may not emit light when the power is applied to the electrode assembly.

Also, even though the nano-scale LED device has a length H that satisfies a following condition in the relation expression 1: $X+Y+Z \le H < X+Y+2Z$, and the nano-scale LED device is electrically connected, it may be difficult to realize the sub pixel emitting light having desired light intensity.

Particularly, since a sixth nano-scale LED device 126 of FIG. 11 is electrically connected to the first and second electrodes 111 and 131, when power is applied to the electrode assembly, the nano-scale LED device 126 may emit light. However, since the nano-scale LED device 126 is obliquely mounted on the first and second electrodes 111 and 131, but is not vertically aligned with the first and second electrode 111 and 131, an area of the electrode assembly that is occupied by mounting the one nano-scale LED device may increase. Thus, the number of nano-scale LED devices that are capable of being mounted on the limited area of the sub pixel may decrease, and it may be difficult to realize the sub pixel emitting light having the desired light intensity.

According to an embodiment of the present invention, the nano-scale LED device may have a length H that satisfies a following condition in the relation expression 2: $H \le X+Y+Z$. In this case, the sub pixel electrically connected without occurring the electrical short-circuit regardless of the position of the active layer coated with the insulation film in the longitudinal direction of the nano-scale LED device may be realized, and the area of the electrode assembly occupied by the one nano-scale LED device may decrease to increase the number of nano-scale LED devices to be mounted on the sub pixel having the limited area, thereby realizing the desired display.

Next, in a step (4) according to the first embodiment of the present invention, power is applied to the plurality of electrode assembles to form a plurality of sub pixels connected to both of the first and second electrodes and including the plurality of nano-scale LED devices.

As illustrated in FIG. 7B, the plurality of nano-scale LED devices 120 may be self-aligned as illustrated in FIG. 7C by applying power to the first and second electrodes for about 5 seconds to 120 seconds and then be connected to both of the first and second electrodes 110 and 130. Also, as illustrated in FIG. 8B, the plurality of nano-scale LED devices 121 may be self-aligned by applying the power to the first and second electrodes and then be connected to the first and second electrodes at the same time as illustrated in FIG. 8C.

If the LED device is distinguished through a naked eye or has a size that is enough to manually or mechanically move the LED device, the LED devices may be disposed one by one on the two electrodes different from each other to connect the LED devices to both of the electrodes different from each other. For example, the general LED device may be manually arranged in a lay state between the different electrodes of a planar electrode.

However, it may be difficult to physically locate the nano-scale LED device according to the present invention, and thus, the nano-scale LED device may not be connected to both of the nano-scale electrodes spaced apart from each other on the same plane. Also, when the nano-scale LED device has a cylindrical shape, if the nano-scale LED device is only injected into the electrodes, the nano-scale LED devices may not be self-aligned and be rolled on the electrodes. Thus, the power may be applied to the electrode assembly to connect the nano-scale LED devices to both of two electrodes different from each other, thereby solving the above-described limitation.

The applied power in the step (4) may be variable power having a predetermined amplitude and period and also be a sine wave or pulse wave having a wave form except for the sine wave. For example, AC power may be applied, or DC power of 0V, 30V, 0V, 30V, 0V, and 30V may be repeatedly applied to the first electrode 1,000 times, and DC power of 30V, 0V, 30V, 0V, 30V, and 0V which are inverted may be repeatedly applied to the second electrode to generate a variable voltage having the predetermined amplitude and period.

The power may be a voltage (amplitude) of about 0.1 V to about 1,000 V and a frequency of about 10 Hz to about 100 GHz. The self-aligned nano-scale LED devices may be contained in a solvent and then injected into the electrode assembly. The solvent may drop onto the electrode and simultaneously be evaporated. Also, since charges are asymmetrically induced to the nano-scale LED devices due to induction of electric fields generated by a potential difference between the two electrodes, both ends of the nano-scale LED device may be self-aligned between the facing two electrodes different from each other. The nano-scale LED device may be connected to the two electrodes different from each other by applying power for about 5 seconds to about 120 seconds.

In the manufacturing method according to the present invention, the number N of nano-scale LED devices connected to both of the first and second electrodes may depend on several variables that are adjustable in the step (4). The variable may include a voltage V of the power, a frequency F (Hz) of the power, a concentration C (wt % of the nano-scale LED) of the solution containing the nano-scale LED devices, a distance Z between the two electrodes, and an aspect ratio AR (where AR=H/D, and D is a diameter of the nano-scale LED). Here, the number N of nano-scale LED devices connected to both of the first and second electrodes may be in proportion to the voltage V, the frequency F (Hz), the concentration C of the solution containing the nano-scale LED devices, and an aspect ratio AR of the nano-scale LED and be in inverse proportion to the distance Z between the two electrodes.

Thus, the nano-scale LED devices may be self-aligned between the two electrodes different from each other by the induction of the electric fields generated by the potential difference between the two electrodes. Here, the more the intensity of the electric fields increases, the more the number of nano-scale LED devices may increase. Also, the intensity of the electric fields may be in proportion to a potential difference V between the two electrodes and be in inverse proportion to the distance Z between the two electrodes.

Next, the more the concentration C (the wt % of the nano-scale LED devices) of the solution containing the nano-scale LED devices increases, the more the number of LED devices connected to the electrodes may increase.

In case of the frequency H (Hz), since a difference in charge generated in the nano-scale LED device may vary according to the frequency, if the frequency increases, the number of nano-scale LED device may increase. However, if the frequency is greater than a predetermined value, the number of nano-scale LED devices connected to the electrodes may decrease.

If the aspect ratio of the nano-scale LED device increases, the induced charge of the electric fields increases. Thus, more number of nano-scale LED devices may be aligned. Also, when considering the electrode assembly having a limited area in spatial aspect of the alignment of the nano-scale LED devices, in a state where the nano-scale LED device has a fixed length, the nano-scale LED device may decrease in diameter. Thus, if the aspect ratio increases, the number of nano-scale LED devices connected to the electrode assembly having the limited area may increase.

The above-described factors may adjust the number of LED devices connected to the electrodes according to their purposes. Thus, according to the present invention, the above-described factors may be adjusted to adjust the number of nano-scale LED device provided in the sub pixel according to its purpose, and also, the nano-scale LEDs may be provided at high density on each pixel to realize a full-color LED display having high resolution.

Also, even though the power is applied to the electrode line according to the aspect ratio of the nano-scale LED device in the step (2) according to the present invention, it may be difficult to self-align the nano-scale LED devices. Thus, according to an embodiment of the present invention, the aspect ratio of the nano-scale LED device according to the present invention may be about 1.2 to about 100, preferably, about 1.2 to about 50, more preferably, about 1.5 to about 2.0, and further preferably, about 1.5 to about 10. If the aspect ratio of the nano-scale LED device is about 1.2 or less, even though the power is applied to the electrode line, the nano-scale LED devices may not be self-aligned. If the aspect ratio of the nano-scale LED device exceeds about 100, a voltage of the power for self-aligning the nano-scale LED devices may be reduced. However, when the nano-scale LED device is manufactured by using the dry etching, it may be difficult to manufacture the device having the aspect ratio that exceeds about 100.

In the step (4) according to the first embodiment of the present invention, the plurality of sub pixels may have the same area or areas different from each other. Preferably, in the sub pixel, a unit sub pixel area, i.e., an arrangement region in which two electrodes for independently operating the arranged nano-scale LED devices are disposed may have an area of about 50 $\mu m^2$ to about 100,000 $\mu m^2$, preferably, an area of about 100 $\mu m^2$ to about 50,000 $\mu m^2$, but is not limited thereto. Preferably, the sub pixel may have an area of about 50 $\mu m^2$ to about 100,000 $\mu m^2$. If the unit electrode of the nano-scale LED electrode assembly has an area of 50 $\mu m^2$ or less, since the nano-scale LED device has to be reduced in length, this may have an influence on the manufacture of the nano-scale LED device. If the area of the unit electrode exceeds about 100,000 $\mu m^2$, the number of nano-scale LED devices may increase to increase the manufacturing costs, and also, non-uniformity in distribution of the nano-scale LED devices may occur. In addition, since the number of pixels disposed on the limited area of the display is less, it may be difficult to realize the display having the high resolution. Preferably, the total number of sub pixels according to an embodiment of the present invention may be about 5 to about 10,000. However, the present invention is not limited thereto. For example, the total number of sub pixels may vary according to the area and/or resolution of the display.

Preferably, the number of nano-scale LED devices per an area ($100 \times 100$ μm$^2$) of the sub pixel may be about 2 to about 100,000. More preferably, the number of nano-scale LED devices may be about 10 to about 10,000. If the number of nano-scale LED devices is less than 2, it may be difficult to minimize a ratio (%) in variation of optical characteristics due to the defects of the nano-scale LED devices in a portion of the two nano-scale LED devices. Thus, it may be difficult to allow the nano-scale LED device to normally emit light in the sub pixel, and thus, the defect of the whole LED display may occur. If the number of nano-scale LED devices exceeds about 100,000, the manufacturing costs may increase, and also, it may be difficult to align the nano-scale LED devices.

According to the present invention, the plurality of nano-scale LED devices are provided in the sub pixel. Thus, since one nano-scale LED is attached to the unit pixel in the LED display according to the related art, if the nano-scale LED is defective, the whole LED display may be deteriorated in efficiency, and the display itself may be defective. According to an embodiment of the present invention, the plurality of nano-scale LEDs may be provided in the sub pixel to solve the above-described limitation. If only one nano-scale LED is used, the defect of the one nano-scale LED may cause 100% of variation in optical characteristic. However, if the number of nano-scale LEDs increases, the ratio (%) of the variation in optical characteristics due to the defect of the one nano-scale LED may be reduced. Thus, according to the present invention, a plurality of blue nano-scale LED may be provided to reduce the defect rate. Thus, even though portions of the plurality of nano-scale LED devices provided in the sub pixel are defective, since other nano-scale LED devices are normal, the normal light emission by the nano-scale LED devices in each of the sub pixels may be enabled on the whole, and thus, the defect rate of the whole LED display may be minimized to maximize the light emitting efficiency.

After the step (4), the manufacturing method according to the present invention may further include: a step (5) of forming a metal ohmic layer on a connection portion between the first and second electrodes and the nano-scale LED device formed on the plurality of sub pixels; a step (6) of forming a short-wave pass filter (SPDF) on an upper portion of each of the plurality of sub pixels including the metal ohmic layer; a step (7) of patterning a green conversion layer on an upper portion of the shortwave-pass filter (SPDF) corresponding to the selected sub pixels of the plurality of sub pixels and patterning a red conversion layer on the upper portion of the short-wave pass filter (SPDF) corresponding to the selected sub pixels of the plurality of sub pixels; and a step (8) of forming a long-wave pass filter (LPDF) on the upper portions of the green and red color conversion layers.

First, in the step (5), the metal ohmic layer may be formed at the connection portion between the first and second electrodes and the nano-scale LED device of the plurality of sub pixels. A reason in which the metal ohmic layer is formed is because the nano-scale LED devices emit light when the power is applied to the two electrodes different from each other, to which the plurality of nano-scale LED devices are connected. Here, the contact between the electrode and the nano-scale LED device may cause ohmic resistance due to electrical contact between the materials different from each other, and an increase in resistance may increase heat generation of the pixel to deteriorate durability of the pixel and significantly deteriorate light emitting efficiency. Thus, to reduce the resistance, the metal ohmic layer may be formed.

Figure 12:
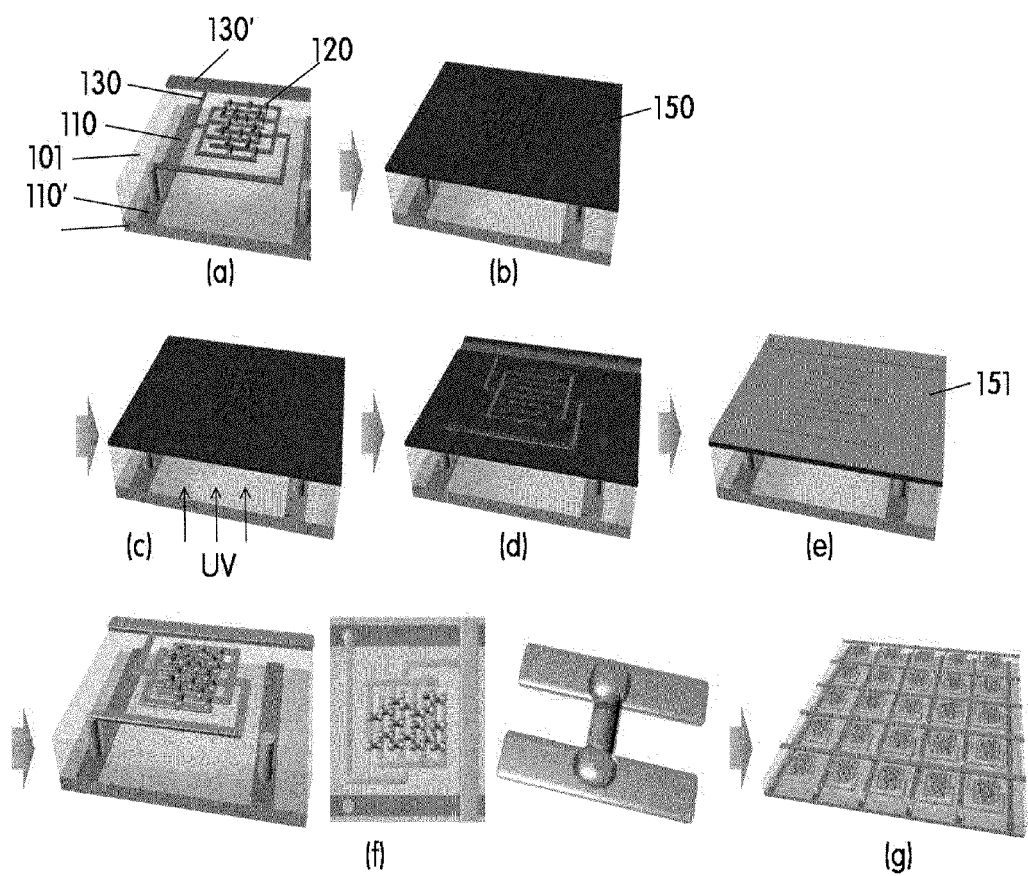
FIG. 12 is a schematic view illustrating a process of forming a metal ohmic layer according to an embodiment of the present invention.

Particularly, FIG. 12 is a schematic view illustrating a process of forming the metal ohmic layer according to an embodiment of the present invention. Although the metal ohmic layer is formed through the following process, the present invention is not limited thereto. That is, a general method for forming the metal ohmic layer may be used.

First, FIG. 12A illustrates an electrode assembly including an electrode I 110' formed on the substrate 100, a first electrode 110 connected to the electrode I 110' and formed on the insulation layer 110 formed the substrate 100 in addition to the electrode I 110', an electrode II 130' formed on the insulation layer 110, and a second electrode 130 connected to the electrode II 130', formed on the insulation layer, and spaced apart from the first electrode 110 on the same plane as the first electrode 110 and a plurality of nano-scale LED devices 120 that are self-aligned with the first and second electrodes of the sub pixel formed on the electrode assembly and connected.

Thereafter, a photo resist (PR) 150 may be applied on the sub pixel site at a thickness of about 2 μm to about 3 μm as illustrated in FIG. 12B. The coating may be performed through one of spin coating, spray coating, and screen printing, but is not limited thereto, preferably, the spin coating, but is not limited thereto. The applied photo resist 150 may have a thickness of about 0.1 μm to about 10 μm, but is not limited thereto.

Next, as illustrated in FIG. 12C, UV light may be irradiated in a direction of the applied photo resist layer from a lower side of the substrate to cure an upper portion of the electrode and/or the remaining photo resist layer except for the photo resist layer applied to an upper portion of the nano-scale LED device and remove the photo resist layer on the upper portion of the electrode, which is not cured as illustrated in FIG. 12*d*, by using a general photo resist stripper.

Thereafter, as illustrated in FIG. 12E, gold or silver may be deposited on the upper portion of the electrode, from which the photo resist is removed, through vacuum deposition or electrochemical deposition, or gold nano crystal or silver nano crystal may be electrically sprayed and applied to form a metal deposition layer 151. The deposited material and the deposition method are not limited thereto. For example, if the material is well-known and used for forming the metal ohmic layer in the ordinary skill in the art, the material is not limited to the above-described materials. For example, the applied metal deposition layer 151 may have a thickness of about 5 nm to about 100 mm, but is not limited thereto.

After the photo resist layer that is not removed in FIG. 12*d* is removed by using one photo resist stripper of acetone, 1-methyl-2-pyrrolidone (NMP), and dimethyl sulfoxide (DMSO), an electrode I 103'. After the photo resist layer is removed, a thermal processing process is performed at a temperature of about 500° C. to about 600° C. to form the metal ohmic layer of FIG. 12F between both ends of the nano-scale LED device, which are not coated with the insulation film, and the electrode.

Next, in the step (6), the short-wave pass filter (SPDF) may be formed on the upper portion of the plurality of sub pixels including the metal ohmic layer. Preferably, a passivation layer may be formed on the upper portion of the plurality of sub pixels including the metal ohmic layer. The passivation layer may fix the nano-scale LED device and prevent the nano-scale LED device from being oxidized during the electroluminance. Also, the passivation layer may be a polarization layer on which the short-wave pass filter is capable of being deposited.

Figure 13:
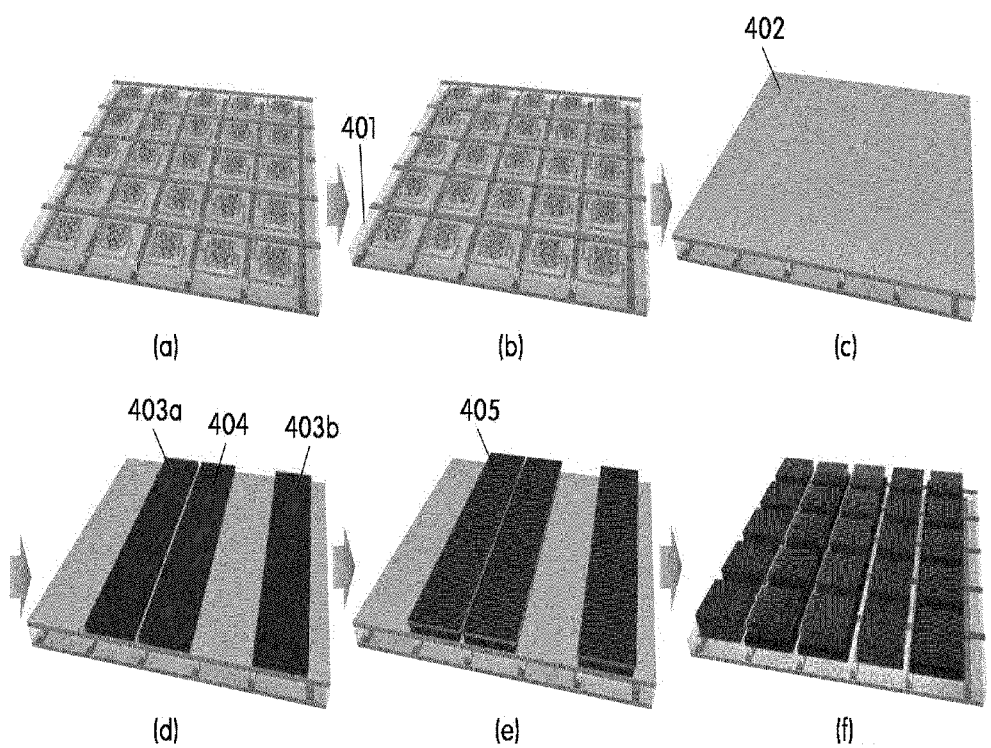
FIG. 13 is a perspective view illustrating a process of depositing a pass filter and patterning a color conversion layer according to an embodiment of the present invention.

FIG. 13 is a perspective view illustrating a process of depositing a pass filter and patterning a color conversion layer according to an embodiment of the present invention. FIG. 13A illustrates a display including a plurality of sub pixel in which the metal ohmic layer is formed on the connection portion between the nano-scale LED device and the first and second electrodes according to an embodiment of the present invention.

As described above, the passivation layer 401 of FIG. 13B may be formed on the upper portion of the display. The passivation layer 401 may be formed of a compound such as silicon dioxide ($SiO_2$), spin-on-glass (SOG), a silicone binder, but the present invention is not limited thereto. More preferably, the passivation layer 401 may be transparent to minimize interference of light with respect to the nano-scale LED device. The passivation layer 401 may be formed through plasma chemical vapor deposition (PECVD) or spin coating. For example, the passivation layer 401 may have a thickness of about 0.5 μm to about 100 μm. However, the present invention is not limited thereto.

Thereafter, as illustrated in FIG. 13C, the short-wave pass filter 402 (SPDF) may be formed on the passivation layer 401. A reason in which the short-wave pass filter 402 is formed is for improving front emission efficiency of the green/red light by transmitting the blue light emitted from a blue LED device and reflecting rear emission occurring a green/red color conversion layer of the display having a color-by blue form that will be described below to a front side.

The short-wave pass filter 402 may be a multi layer in which high refractive/low refractive materials are repeatedly formed. The multi layer may be constituted by $[(0.125)SiO_2/(0.25)TiO_2/(0.125)SiO_2]m$ (where m=repeated layer number, and m is over 5). The short-wave pass filter 402 may have a thickness of about 0.5 μm to about 10 μm, but is not limited thereto. The short-wave pass filter 402 may be formed through at least one of E-beam, sputtering, and atom deposition methods, but is not limited thereto.

In the step (7), the green conversion layer may be patterned on the upper portion of the shortwave-pass filter (SPDF) corresponding to the selected sub pixels of the plurality of sub pixels, and the red conversion layer may be patterned on the upper portion of the short-wave pass filter (SPDF) corresponding to the selected sub pixels of the plurality of sub pixels.

As illustrated in FIG. 13D, the green conversion layers 403a and 403b may be patterned on the upper portion of the shortwave-pass filter 402 (SPDF) corresponding to the selected sub pixels of the plurality of sub pixels, and the red conversion layer 404 may be patterned on the upper portion of the short-wave pass filter 402 (SPDF) corresponding to the selected sub pixels of the plurality of sub pixels. The patterning method may include at least one selected from the group consisting of a screen printing method, a photolithography method, and a dispensing method.

The pattering order of the green conversion layer and the red conversion layer is not limited thereto. For example, the green conversion layer and the red conversion layer may be formed at the same time or may be formed in a reverse order.

Preferably, the nano-scale LED device provided on the plurality of sub pixels may be a nano-scale blue LED for realizing a color-by blue LED display. The green color conversion layers 403a and 403b may be formed on the short-wave pass filter 402 that is formed on an upper portion perpendicular to correspond to the nano-scale blue LED devices provided on the selected sub pixel of the plurality of sub pixels. Blue light irradiated from the nano-scale blue LED device disposed on a lower end of the green color conversion layers 403a and 403b may be irradiated onto the green conversion layers 403a and 403b, and thus the green conversion layers 403a and 403b may emit light to realize the sub pixel for irradiating the green light.

Also, the red color conversion layer 404 may be formed on the short-wave pass filter 402 that is formed on the upper portion perpendicular to correspond to the nano-scale blue LED devices provided on the selected sub pixel of the plurality of sub pixels. Red light irradiated from the nano-scale blue LED device disposed on a lower end of the red color conversion layer 404 may be irradiated onto the red conversion layer 404, and thus the red conversion layer 404 may emit light to emit the red light. In this case, the red color conversion layer 404 may be formed on a region of the plurality of sub pixels on which the above-described green conversion layers 403a and 403b and a portion of the region except for a region in which the blue light is emitted.

When observing the LED display substrate manufactured as described above from a vertical upper side, in a portion of the sub pixel sites, only the short-wave filer may be disposed on the uppermost layer. Also, the green color conversion layer and red color conversion layer may not be formed on a vertical upper portion, and thus, the blue light may not be emitted in the region. On the other hand, the green light may be irradiated onto the portion of the sub pixel sites on which the green color conversion layers 403a and 403b are formed on the upper portion of the short-wave pass filter through the green conversion layer. Also, the red light may be irradiated on the remaining sub pixel sites because the red conversion layer 404 is formed on the upper portion of the short-wave pass filter. Thus, the color-by blue LED display may be realized.

If the general color-by blue manner is capable of being used for the green conversion layers 403a and 403b, the green conversion layers 403a and 403b are not limited to their materials. For example, each of the green conversion layers 403a and 403b may be a phosphor layer including a green phosphor material. That is, the green conversion layers 403a and 403b may include at least one phosphor selected from the group consisting of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4$:Ce, Li, β-SiALON:Eu, $CaSc_2O_4$:Ce, $Ca_3Sc_2Si_3O_{12}$:Ce, Caα-SiALON:Yb, Caα-SiALON:Eu, Liα-SiALON:Eu, $Ta_3Al_5O_{12}$:Ce, $Sr_2Si_5N_8$:Ce, $(Ca,Sr,Ba)Si_2O_2N_2$:Eu, $Ba_3Si_6O_{12}N_2$:Eu, γ-AlON:Mn, and γ-AlON:Mn,Mg.

If the general color-by blue manner is capable of being used for the red conversion layer 404, the red conversion layer 404 is not limited to their materials. For example, each of the red conversion layer 404 may be a phosphor layer including a red phosphor material. That is, the red conversion layer 404 may include at least one phosphor selected from the group consisting of $(Sr,Ca)AlSiN_3$:Eu, $CaAlSiN_3$:Eu, $(Sr,Ca)S$:Eu, $CaSiN_2$:Ce, $SrSiN_2$:Eu, $Ba_2Si_5N_8$:Eu, CaS:Eu, CaS:Eu,Ce, SrS:Eu, SrS:Eu,Ce, and $Sr_2Si_5N_8$:Eu.

Next, in the step (8), the lone-wave pass filter 405 (LPDF) may be formed on the upper portion of the green and red color conversion layers 403a, 403b, and 404.

Before the long-wave pass filter 405 (LPDF) is formed, an insulation layer may be formed on an upper portion of the short-wave pass filter 402 including the patterned color conversion layers 403a, 403b, and 404. Thus, as illustrated in FIG. 13D, a layer may be formed between the portion on which the green or red color conversion layer is formed and the portion on which the green or red color conversion layer is not formed to generate a rough portion. As a result, the insulation layer may be applied to polarize the rough portion. The insulation layer may be formed of one material of spin-on-glass (SOG), a transparent polymer, and a transparent organic material paste through the spin coating or screen printing, but is not limited thereto. For example, the formed insulation layer may have a thickness of about 10 μm to about 100 μm, but is not limited thereto.

Thereafter, as illustrated in FIG. 12E, to prevent color purity from being deteriorated by mixing the blue light emitted from the nano-scale blue LED with the green/red light emitted from the green/red color conversion layer on the upper portion of the insulation layer, the long-wave pass filter 405 (LPDF or LWPF) may be formed. Here, the long-wave pass filter 450 may be formed on a portion or the whole portion of the green color conversion layers 403a and 403b and the red color conversion layer 404, preferably, only the green/red color conversion layer. The long-wave pass filter 405 may be a multi layer in which high refractive/low refractive materials, which transmits long waves and reflects short waves, are repeatedly formed. The multi layer may be constituted by [(0.125)SiO$_2$/(0.25)TiO$_2$/(0.125)SiO$_2$]m (where m=repeated layer number, and m is over 5). The long-wave pass filter 405 may have a thickness of about 0.5 μm to about 10 μm, but is not limited thereto. The long-wave pass filter 405 may be formed through at least one of E-beam, sputtering, and atom deposition methods, but is not limited thereto. Also, to form the long-wave pass filter on only the upper portion of the green/red color conversion layer, the long-wave pass filter may be formed on a desired region by using a metal mask that exposes the green/red color conversion layer and masks the rest portions.

According to another embodiment, a method for manufacturing a display including a nano-scale LED assembly includes: (1) forming an electrode I on a substrate; (2) forming an electrode II on the same plane as the electrode I or on the electrode I to form a plurality of electrode assembles including a first electrode connected to the electrode I and a second electrode spaced apart from the first electrode on the same plane as the first electrode and connected to the electrode II; (3) injecting a plurality of nano-scale LED devices onto a plurality sub pixel sites formed on the plurality of electrode assembles; and (4) injecting a solvent to the plurality of sup pixel sites and applying power to the plurality of electrode assembles to form a plurality of sub pixels including a plurality of nano-scale LED devices connected to both of the first and second electrodes; wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm<X≤10 μm, 100 nm<Y≤10 μm, and 100 nm<Z≤10 μm.

Different points between a second embodiment of the present invention and the first embodiment of the present invention will be described.

In the second embodiment of the present invention, a step (1) and a step (2) are the same as those of the first embodiment. However, the second embodiment of the present invention is different from the first embodiment of the present invention in that a nano-scale LED device, but the solution containing the nano-scale LED device may be injected to the sub pixel sites in a step (3).

In case of the display manufactured according to the first embodiment, since the nano-scale LED device is injected in a solution state, nano-scale LED devices may be aggregated in a sub pixel site and then disposed at a specific portion or be floated in the solution and thus spread to an edge of the sub pixel site so that the nano-scale LED devices are concentratedly mounted on the edge of the sub pixel site.

The second embodiment of the present invention may provide solve the above-described limitation. That is, the nano-scale LED devices may be concentrated and mounted into a desired region of sub pixel site and also be uniformly dispersed and mounted on the desired region to minimize the aggregation of the nano-scale LED devices.

For this, according to the second embodiment of the present invention, the nano-scale LED devices may not be injected into the sub pixel site in the solution state. That is, the nano-scale LED devices may be injected, and then a solvent for moving the nano-scale LED devices may be injected in a step (4). Then, power is applied to allow the nano-scale LED devices to be concentratedly mounted in the desired sub pixel site.

Figure 14:
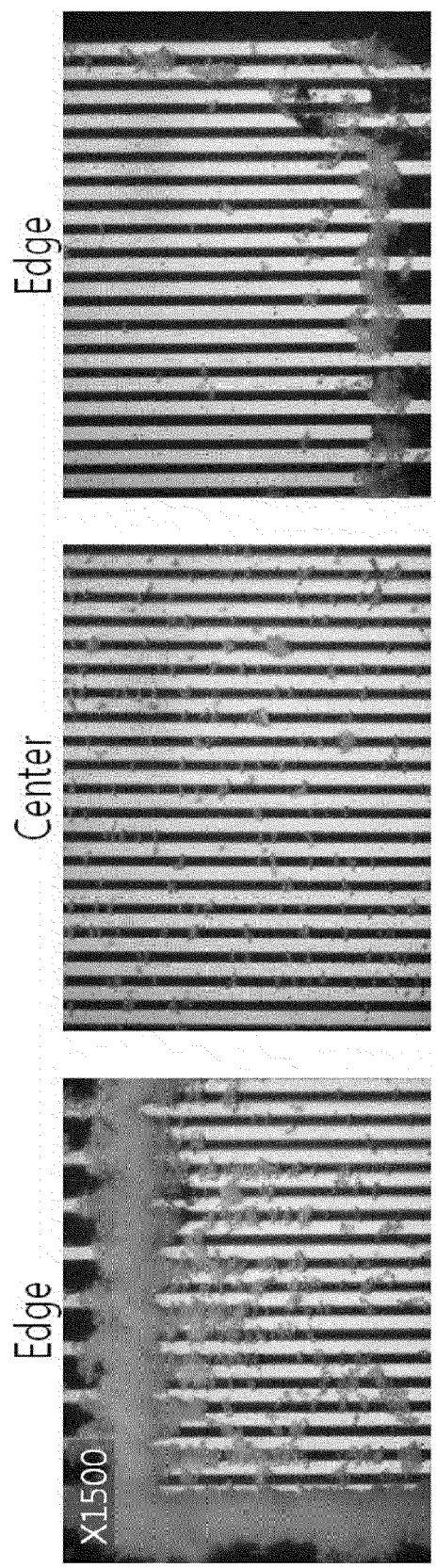
FIG. 14 is an optical microscope photograph obtained by magnifying a display including a nano-scale LED manufactured according to a first embodiment of the present invention by 1,500 times.
Figure 15:
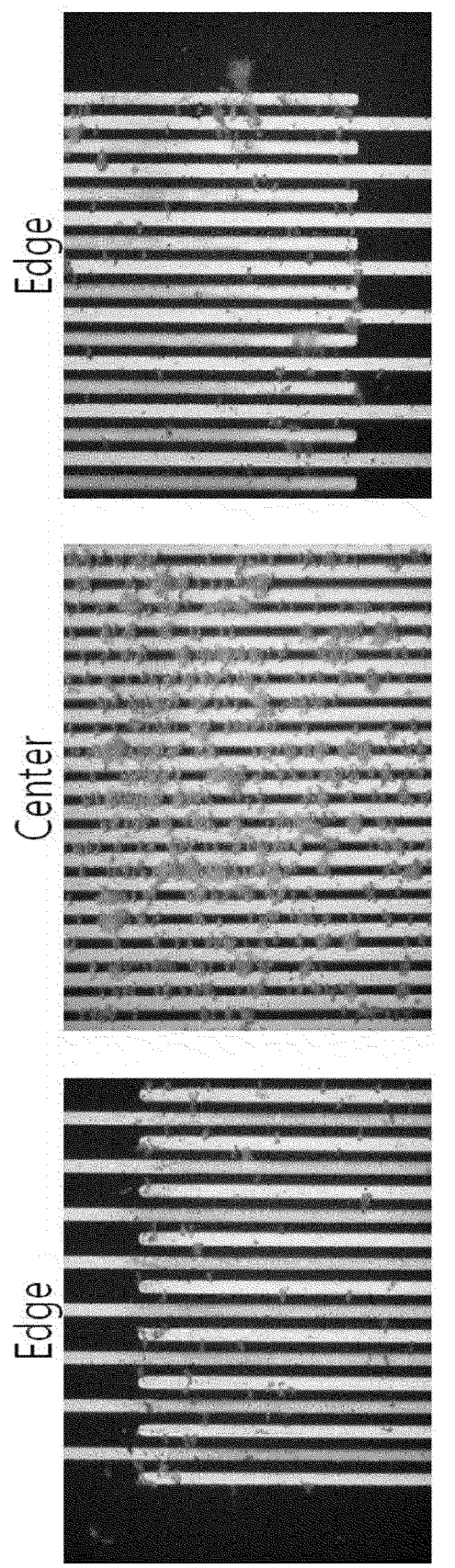
FIG. 15 is an optical microscope photograph obtained by magnifying a display including a nano-scale LED manufactured according to a second embodiment of the present invention by 1,500 times.

FIG. 14 is an optical microscope photograph obtained by the nano-scale LED electrode assembly manufactured according to the first embodiment of the present invention by 1,500 times, and FIG. 15 is an optical microscope photograph obtained by a nano-scale LED electrode assembly manufactured according to a second embodiment of the present invention by 1,500 times. In FIG. 14, it is seen that the nano-scale LED devices are concentratedly mounted at the edge than a center of electrode assembly. Furthermore, it is seen that the nano-scale LED devices are aggregated at the edge and then mounted. On the other hand, in FIG. 15, it is seen that the nano-scale LED devices are not concentrated at the edge of the electrode assembly, but uniformly dispersed at the center to minimize the aggregation of the nano-scale LED devices.

Figure 16:
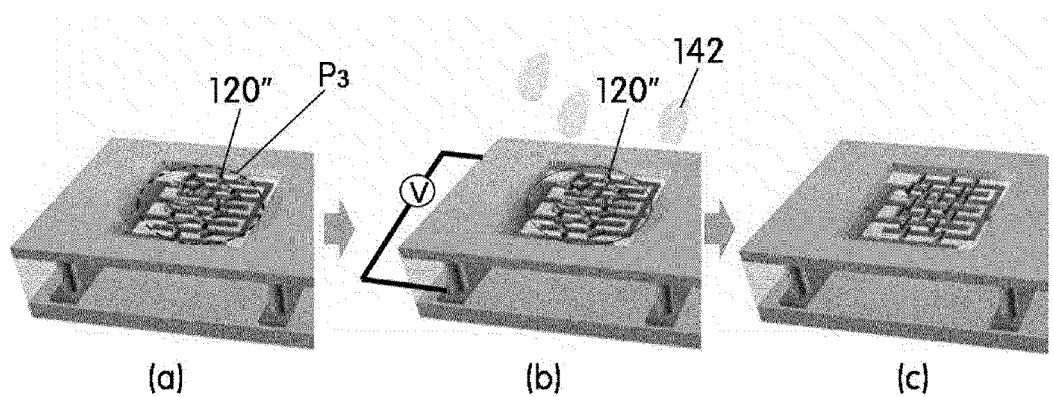
FIG. 16 is a perspective view illustrating a process of manufacturing the nano-scale LED electrode assembly according to the second embodiment of the present invention.

FIG. 16 is a perspective view illustrating a process of manufacturing the nano-scale LED electrode assembly according to the second embodiment of the present invention. FIG. 16A illustrates a plurality of nano-scale LED devices 120" injected onto a sub pixel site P3 in the step (3) according to the second embodiment of the present invention.

In the step (3) according to the second embodiment of the present invention, the method for injecting the nano-scale LED devices into the sub pixel sites is not specifically limited. For example, the nano-scale LED device may be manufactured into a particle having a core shell structure including a core and a polymer shell surrounding the core or a core-sheath complex fiber and then be injected into the sub pixel sites. Here, a specific kind of polymer component for forming the shell (or core-sheath) is not limited if the polymer component does not have an influence on the nano-scale LED device that is immersed into the core (or core-sheath). However, a polymer that is soluble by a solvent to be injected in the step (4) that will be described below may be used. Also, the particle or complex fiber may be changed in diameter and shape according to its purpose, but is not specifically limited.

Also, in the step (3) according to the second embodiment of the present invention, the nano-scale LED device may be injected into the electrode line region surrounded by an insulation barrier. When the solvent is injected in the step (4), escape of the nano-scale LED device to the outside of the electrode assembly may be minimized by the insulation barrier. Since description of the insulation barrier is equal to that of the insulation barrier according to the first embodiment of the present invention, its detailed description will be omitted.

Next, according to the second embodiment of the present invention, the step (4) may include a process of injecting a solvent to a plurality of sub pixel sites to connect a plurality of nano-scale LED devices to both of the first and second electrodes and applying power to a plurality of electrode assembles to form a plurality of sub pixels including a plurality of nano-scale LED devices connected to both of the first and second electrodes.

When the solvent 142 is injected onto the sub pixel sites, and the power may be applied to the electrode assembles to self-align the nano-scale LED devices as illustrated in FIG. 16B, the sub pixels including the nano-scale LED devices connected to the first and second electrodes may be formed as illustrated in FIG. 16C. Since a specific kind of solvent 142 to be injected in the step (4) and intensity of the power are the same as those according to the first embodiment of the present invention, their detailed descriptions will be omitted.

An amount of solvent to be injected in the step (4) may have about 100 weight part to about 12,000 weight part with respect to 100 weight part of the nano-scale LED device to be injected in the step (3). If the amount of solvent exceeds about 12,000 weight part, since the amount of solvent is too much, the nano-scale LED devices may be spread to a region except for the desired electrode line region by the solvent, and thus, the number of nano-scale LED devices to be mounted on a desired mounting area may be very small. If the amount of solvent has about 100 weight part or less, movement or alignment of the nano-scale LED devices may be interrupted.

In the step (4), the injection of the solvent and the applying of the power may be simultaneously or successively performed.

The display manufactured according to the first or second embodiment of the present invention includes: an electrode I disposed on a substrate; an electrode II on the same plane as the electrode I or on the electrode I; a plurality of electrode assemblies including a first electrode connected to the electrode I and a second electrode spaced apart from the first electrode on the same plane as the first electrode and connected to the electrode II; and a plurality of nano-scale LED devices connected to both of the first and second electrodes provided on a plurality of sub pixel sites disposed on the plurality of electrode assembles, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,\qquad \text{[Relation Expression 1]}$$

where 100 nm<X≤10 μm, 100 nm<Y≤10 μm, and 100 nm<Z≤10 μm.

In the method for manufacturing the display including the nano-scale LED according to the first or second embodiment of the present invention, previously described portions and duplicated portion will be omitted.

Figure 17:
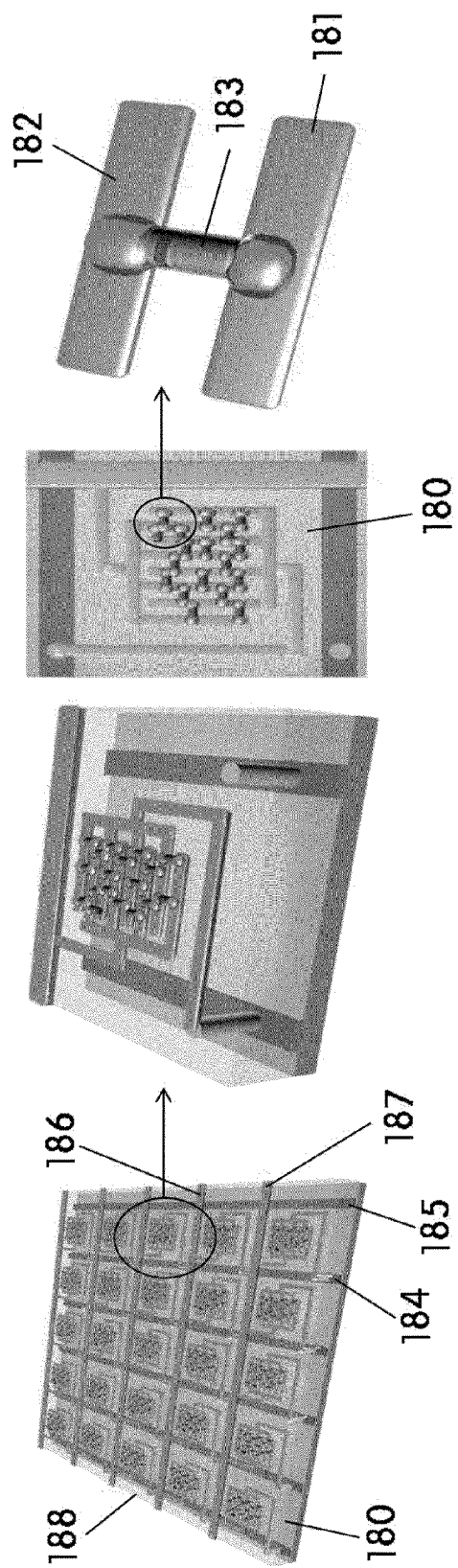
FIG. 17 is a perspective view of a display according to an embodiment of the present invention.

FIG. 17 is a perspective view of a display according to an embodiment of the present invention. The display includes: a plurality of electrode assembles including electrodes I 184 and 185 formed on a substrate 180, electrodes II 186 and 187 formed on the electrodes I 184 and 185, a first electrode 181 connected to the electrodes I 184 and 185, and a second electrode 182 spaced apart from the first electrode 182 on the same plane as the first electrode 182 and connected to the electrodes II 186 and 187; and a plurality of sub pixels including a plurality of nano-scale LED devices 183 connected to both of the first and second electrodes 181 and 182 of the electrode assembly. Also, an insulation layer 188 may be formed on the substrate 180 including the electrodes I 184 and 185, and the first electrode 181, the electrodes II 186 and 187, and the second electrode 182 connected to the electrodes II 186 and 187 may be formed on an upper portion of the insulation layer 188.

Preferably, the substrate 180 according to an embodiment of the present invention may be formed of a flexible plastic material. In the application of the display in recent years, the display may be increasingly used for electronic equipment that is utilized at a fixed position, like the related art, as wall as used for electronic equipment having mobility and portability. To improve the portability of the display, it is important to reduce a size of the display. In addition, if the display is bendable or rollable, the portability of the display may increase. Thus, the substrate according to an embodiment of the present invention may be formed of a flexible plastic material. Thus, the display may be utilized for the various electronic equipment having the portability.

Preferably, the electrodes I 184 and 185 and the electrodes II 186 and 187 may be provided in plurality. The arrangement of the electrodes I 184 and 185 and the electrodes II 186 and 187 may vary according to their purpose. If the electrodes I 184 and 185 and the electrodes II 186 and 187 are provided in plurality, each of the sub pixels provided on the plurality of sub pixel sites that are formed through the electrodes may be independently controlled. If the electrodes I 184 and 185 and the electrodes II 186 and 187 are provided in plurality, since the crossing points between the electrodes I 184 and 185 and the electrodes II 186 and 187 form the sub pixels, the resolution of the display may be determined according to the number of electrodes I and the number of electrodes II. Thus, to manufacturing the display having the high resolution, the number of electrodes I and II may increase according to the number of pixels.

Particularly, the plurality of electrodes I 184 and 185 and electrodes II 186 and 187 may cross each other in a strip shape, and the sub pixels may be disposed in spaces that are partitioned by the electrodes crossing each other.

According to the related art, to realize the display, the plurality of LED devices are three-dimensionally connected to the electrodes when the sub pixels are disposed on the electrodes. However, it may be very difficult to three-dimensionally the nano-scale LED devices to the electrodes. Even though the nano-scale LED devices are three-dimensionally connected to the electrodes, the photons generated in the active layer of the nano-scale LED devices may be blocked by the electrodes and thus may not be escaped to the outside, but be absorbed in the active layer to deteriorate the light extraction efficiency. However, according to the present invention, since the sub pixels are disposed in the spaces that are partitioned by the electrodes I 184 and 185 and the electrode II 186 and 187, the phenomenon in which the photons generated in the active layer of the nano-scale LED devices 183 are blocked by the electrodes and thus are not emitted to the outside may be minimized to improve the light extraction efficiency.

To more improve extraction efficiency, the nano-scale LED devices connected to the first and second electrodes may be laid on the substrate. In detail, the nano-scale LED devices may be laid parallel to the substrate.

Figure 18:
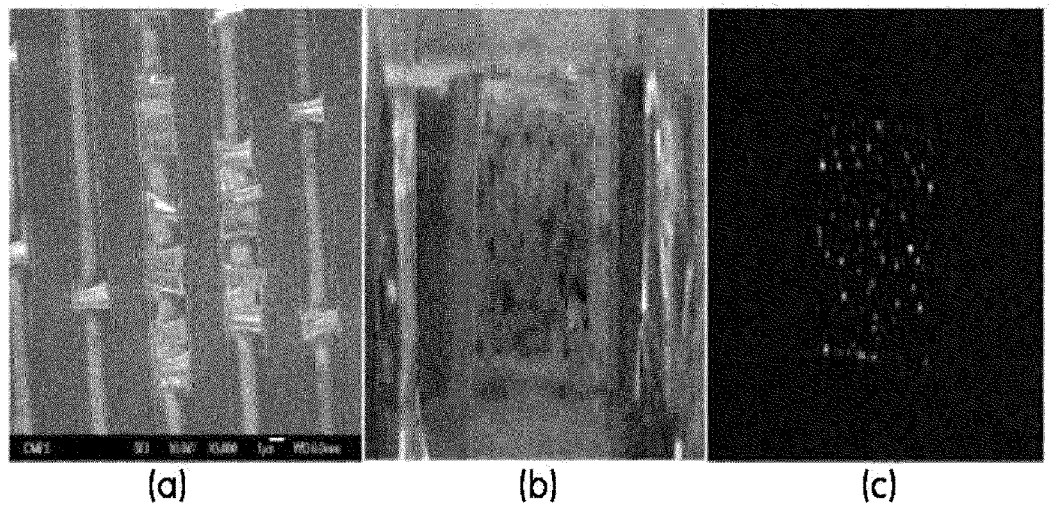
FIG. 18A is an SEM photography according to an embodiment of the present invention.
FIGS. 18B and 18C are blue electroluminescent photograph of a unit electrode in which sub pixels are provided according to an embodiment of the present invention.

Particularly, in FIG. 17, it is seen that the nano-scale LED devices 183 are connected to the first and second electrodes 181 and 182 in the "parallely laid state" on the base substrate. FIG. 18A is an SEM photography according to an embodiment of the present invention. In the SEM photograph according to an embodiment of the present invention, the first electrode may have a width of about 3 μm, the second electrode may have a width of about 3 μm, a distance between the electrodes may be about 2 μm, and each of the electrodes may have a thickness of about 2 μm. Also, the nano-scale LED device connected to the electrode may have a length of about μm and a radius of about 500 nm, and a paste concentration injected to be connected to the electrode may have about 1.0 weight part of nano-scale LED device with respect to 100 weight part of acetone. Furthermore, to self-align the nano-scale LED device with the electrode, AC power having a voltage of about VAC=30 V and a frequency of about 500 kHz may be applied for one minute.

As seen in the SEM photograph, the nano-scale blue LED device is disposed to be hung on the first and second electrodes or inserted between the two electrodes. Also, it is seen that the nano-scale LED device is laid when connected.

FIGS. 18B and 18C are a blue electroluminescent photograph of a unit electrode including the sub pixels according to an embodiment of the present invention. Here, FIG. 18B is a photograph that is photographed in a dark room, and FIG. 18C is a photograph that is photographed in a bright room. According to an embodiment of the present invention, a subject of the photography may be a unit electrode including a plurality of sub pixels that are formed on an area of 0.6 cm×0.7 cm. Here, it is seen that the nano-scale LED devices of the sub pixels have point emission, and also, the nano-scale LED devices having the point emission are coupled to realize surface emission.

Thus, since the plurality of nano-scale LEDs are easily assembled on the electrodes having a wide area by using the nano-scale LED devices, if the nano-scale LEDs are integrated to a color cell level, the display may be realized. Furthermore, if the flexible substrate is used, the flexible display may be realized.

Thus, the nano-scale LED device horizontally assembled to be lied on the electrodes that are interdigitatedly disposed may be a high efficiency LED device having high light extraction efficiency. Thus, it is seen in literature that the color cell form including the nano-scale LED device are capable of being realized.

Also, FIGS. 18B and 18C illustrate a state in which the metal ohmic layer is not provided between the nano-scale LED device and the electrode according to an embodiment of the present invention. Thus, if the metal ohmic layer may be further provided to reduce resistance between the nano-scale LED device and the electrode, the light emitting efficiency may be further improved, and thus high-resolution full-color LED may be realized.

Figure 19:
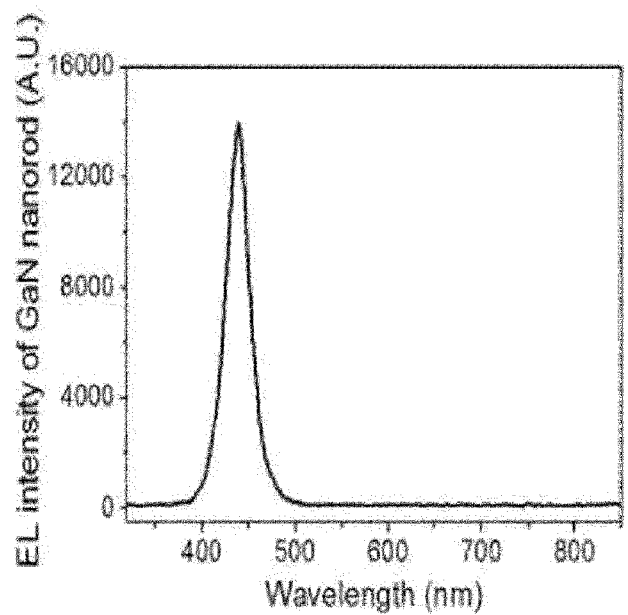
FIG. 19 is an electroluminescent spectrum of the sub pixels according to an embodiment of the present invention.

Furthermore, FIG. 19 is a blue electroluminescence spectrum of the sub pixels according to an embodiment of the present invention. That is, FIG. 16 illustrates a result obtained by measuring electroluminescence by using a spectrometer according to an embodiment of the present invention. The electroluminescent blue nano-scale LED device may be a nano-scale LED device that is manufactured by using a wafer substrate. Here, it is seen that the original blue emission such as the emission spectrum of FIG. 19 is well maintained after the nano-scale LED devices on which various drying etching processes and laser lift-off processes are performed to manufacture the nano-scale LED device are self-aligned between the electrodes different from each other.

It is indirectly seen that defects occurring during the process of manufacturing the nano-scale LED devices that are horizontally arranged are minimized. That is, in the process of manufacturing the nano-scale LED device by using a blue wafer, stress and defects existing in the wafer substrate may be reduced by the process of reducing the LED device to a nano-size and the etching process to manufacture the nano-scale LED device having superior crystalline. Here, it is seen that the nano-scale LED devices having the superior crystalline excellently emit light in the state where the nano-scale LED devices are self-aligned on the electrodes different from each other in the process for manufacturing the display.

According to the present invention, since the nano-scale LED device is connected to be parallely laid with respect to the substrate, the light extraction efficiency may be maximized.

In general, performance of the LED device may be evaluated through external quantum efficiency. The external quantum efficiency denotes a ratio of the number of photons leaking to the outside of the LED, i.e., air for a unit time to the number of carriers injected into the LED device for the unit time. The external quantum efficiency may be expressed as following relation expression between internal quantum efficiency and light extraction efficiency.

External quantum efficiency=internal quantum efficiency×light extraction efficiency    [Relation Expression]

The internal photon efficiency denotes a ratio of the number of photons emitted form the active layer for the unit time to the number of carrier injected into the LED device for the unit time, and the light extraction efficiency denotes a ratio of the number of photons leaking to the air for the unit time to the number of photons emitted from the active layer for the unit time. As a result, to improve the performance of the LED device, the improvement of the efficiency is impossible.

However, in aspect of the light extraction efficiency, light emitted to the air through the upper and lower electrodes or the n-type conductive semiconductor layer and p-type conductive semiconductor layer of the nano-scale LED device having a thin film shape may have very low extraction efficiency. This is done for a reason in which, since the most light emitted from the LED device is totally reflected by a difference in refractive index on an interface between a high-refractive semiconductor layer and a high-refractive air layer, the light is captured in the semiconductor layer, and thus, a large amount of light emitted from the active layer is not escaped in the light extraction direction, but is reabsorbed or dissipated as heat. This may be caused due to the LED device having the existing thin film structure.

To solve this limitation, the nano-scale LED device may be connected to the electrode in the laid state to remove the flat interface between the high-refractive semiconductor layer and the air layer. Thus, the possibility of an occurrence of the total reflection may be minimized to minimize the light emitted form the nano-scale LED device, which is not extracted to the outside, but is captured in the semiconductor layer, thereby emitting the most light to the outside. Thus, the full-color LED display in which the conventional light extraction reduction limitation is solved may be provided.

Figure 20:
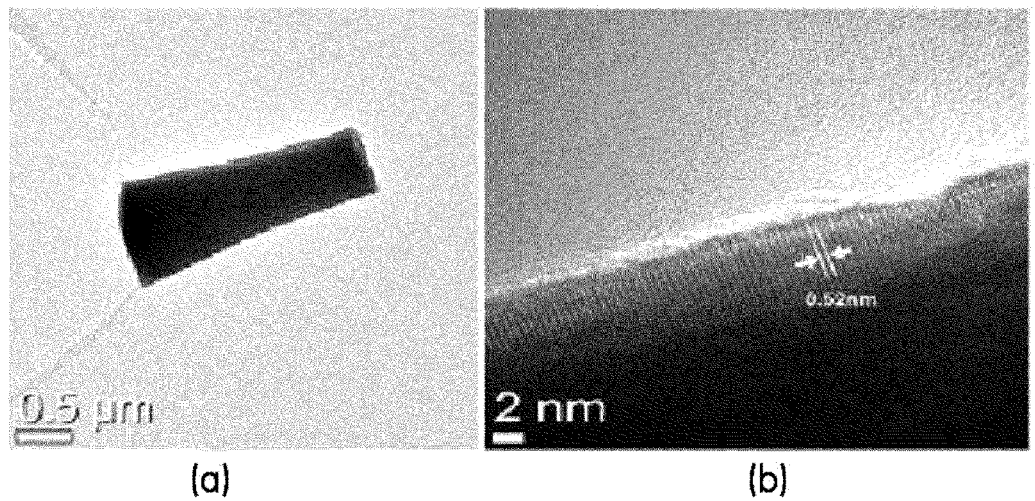
FIG. 20 is a TEM photograph of the nano-scale LED device according to an embodiment of the present invention.

FIG. 20 is a TEM photograph of the nano-scale LED device according to an embodiment of the present invention. FIG. 20A is a TEM photograph illustrating the whole nano-scale LED device having a cylindrical shape, and FIG. 20B is a high resolution TEM photograph illustrating a surface of the nano-scale LED device. As seen in FIG. 20B, it is seen that, even though the dry etching process and the laser lift-off process are performed to manufacture the nano-scale LED device, atoms of an InGaN crystal around the surface of the nano-scale LED device are regularly and well arranged. Thus, it is seen that the crystalline of the nano-scale LED device which is obtained through the various manufacturing processes is very important. Also, it is seen that the high-efficiency nano-scale LED device is capable of being manufactured. That is, since the crystalline of the manufactured nano-scale LED device is very important, the internal quantum efficiency may be superior. Also, since the nano-scale LED devices are horizontally aligned between the two electrodes different from each other, the light extraction efficiency may be superior. Thus, it is directly seen that the full-color LED display including the high-efficient LED device having the superior internal and external quantum efficiency is realizable.

The nano-scale LED device (see reference numeral 183 of FIG. 13) provided in the display according to the present invention may be inserted to be connected between the first electrode 182 and the second electrode 181 or may be disposed to be connected to be hung on the first electrode 182 and the second electrode 181.

Thus, a length H of the nano-scale LED device provided in the display according to the present invention, a width X of the first electrode, a width Y of the second electrode, and a distance Z between the first and second electrodes may satisfy a following relation expression 1.

$$0.5Z \leq H < X+Y+2Z,$$ [Relation Expression 1]

where 100 nm<X≤10 μm, 100 nm<Y≤10 μm, 100 nm<Z≤10 μm. More preferably, the relation expression 1 may satisfy a following condition: Z≤H<X+Y+2Z, more preferably, Z≤H≤X+Y+Z. Since this has been described above, their detailed descriptions will be omitted.

A portion at which the nano-scale LED device is connected to the electrode may be connected to at least one electrode of the electrode layer and the conductive type semiconductor layer of the nano-scale LED device.

However, if the conductive type semiconductor layer provided in the nano-scale LED device or the electrode layer formed on each of the upper and lower portions of the conductive type semiconductor layer are connected to be hung on the first and second electrodes, the electric short-circuit may not occur. However, if a portion or the whole of the active layer of the nano-scale LED device contacts the electrodes, the electrical short-circuit may occur to generate defective pixels. To solve the above-described limitation, the nano-scale LED device provided in the display according to the present invention may include the insulation film applied to the outer surface of the device in addition to the outer surface of the active layer to prevent the defective pixels due to the electrical short-circuit from being generated. In this case, even thought the portion of the active layer of the nano-scale LED device contacts the electrodes, the insulation film may be provided to prevent the electrical short-circuit from occurring. However, a portion or the whole of the electrode layer disposed on each of the upper and lower portions of the conductive type semiconductor layer of the nano-scale LED device has to be electrically connected to the electrodes, and thus, the insulation film may not be provided.

The display may further include: an insulation layer including the electrode I and disposed on the substrate and under the electrode II; a metal ohmic layer including connection portions between the first and second electrodes disposed on a plurality of sub pixels and the nano-scale LED devices; a short-wave pass filter (SPDF) disposed on an upper portion of each of the plurality of sub pixels including the metal ohmic layer; a green color conversion layer patterned on an upper portion of the short-wave pass filter (SPDF) corresponding to the selected sub pixels of the plurality of sub pixels and a red color conversion layer patterned on an upper portion of the short-wave pass filter (SPDF) corresponding to the selected sub pixels of the plurality of sub pixels; and a long-wave pass filter (LPDF) disposed on upper portions of the green color conversion layer and the red color conversion layer. The descriptions of an insulation layer and a short-wave pass filter which may be further provided are the same as those in the manufacturing method according to the first embodiment and thus will be omitted. The nano-scale LED device provided in the display manufactured according to first or second embodiment may be a nano-scale blue LED device. Thus, the color-by blue type display may be realized by using the nano-scale blue LED device.

Also, the display according to the present invention may further include an insulation barrier that surrounds each of the plurality of sub pixels. Thus, the phenomenon in which the nano-scale LED devices are dispersed into the sub pixels on the whole, and thus the nano-scale LED devices are connected to the electrodes at the edge region or undesired region outside the sub pixels may be prevented. This description is the same as that in the manufacturing method according to the first embodiment and thus will be omitted.

Also, in the display according to the present invention, the number of nano-scale LED device per an area (100×100 μm$^2$) of the sub pixel may be about 10 to about 10,000. Also, the nano-scale LED device may have a length of about 100 nm to about 10 μm and an aspect ratio of about 1.2 to about 100.

According to a third embodiment of the present invention, a method for manufacturing a display including a nano-scale LED assembly includes: (1) forming an electrode I on a substrate; (2) forming an electrode II on the same plane as the electrode I or on the electrode I to form a plurality of electrode assembles including a first electrode connected to the electrode I and a second electrode spaced apart from the first electrode on the same plane as the first electrode and connected to the electrode II; (3) independently injecting a first solution containing a plurality of blue nano-scale LED devices, a second solution containing a plurality of green nano-scale LED devices, and a third solution containing a plurality of red nano-scale LED devices onto a plurality of sub pixel sites formed on the plurality of electrode assemblies; and (4) applying power to the plurality of electrode assemblies to form a plurality of sub pixels including the plurality of nano-scale LED devices connected to both of the first and second electrodes, wherein each of the nano-scale LED devices includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm<X≤10 μm, 100 nm<Y≤10 μm, and 100 nm<Z≤10 μm.

More preferably, the relation expression 1 may satisfy a following condition: Z≤H<X+Y+2Z, more preferably, the relation expression 2 may satisfy a following condition: Z≤H≤X+Y+Z. Since this has been described above, their detailed descriptions will be omitted.

In a third embodiment of the present invention, duplicated portions with the manufacturing method according to the first embodiment will be omitted.

First, steps (1) to (3) are the same as those according to the first embodiment of the present invention. However, in the step (3), a solution containing a plurality of nano-scale LED devices is injected. The solution may include a first solution containing blue nano-scale LED devices, a second solution containing a plurality of green nano-scale LED devices, and a third solution containing a plurality of red nano-scale LED devices.

The display according to the first embodiment may include the color conversion layer to realize the full-color RGB LED display. However, in the display according to the third embodiment, the nano-scale LED device itself may emit RGB light to realize the full-color RGB LED display without using the color conversion layer.

For this, the solution containing the plurality of nano-scale LED devices may be injected. Here, the nano-scale LED devices may include LED devices that emit green, blue, and red light, respectively. Since the independently operable one sub pixel has to emit only one color light, only the nano-scale LED devices having one color may be contained in one kind of solution. Thus, according to the third embodiment of the present invention, in the step (3), one of the first to third solutions containing the nano-scale LED devices having the corresponding color may be injected to the sub pixel sites on which the blue sub pixels, the green sub pixels, and the red sub pixels are respectively disposed. The solution containing one kind of nano-scale LED devices of the blue, green, and red LED devices may be injected at the same time or successively injected regardless of the color or order.

Next, in a step (4), power is applied to the plurality of electrode assemblies to form a plurality of sub pixels connected to both of the first and second electrodes and including the plurality of nano-scale LED devices.

The process of applying the power to the electrode assembly to connect the nano-scale LED to the electrode assembly and the description of the sub pixel are the same as those in the manufacturing method according to the first embodiment, and thus, their duplicated descriptions will be omitted.

Figure 21:
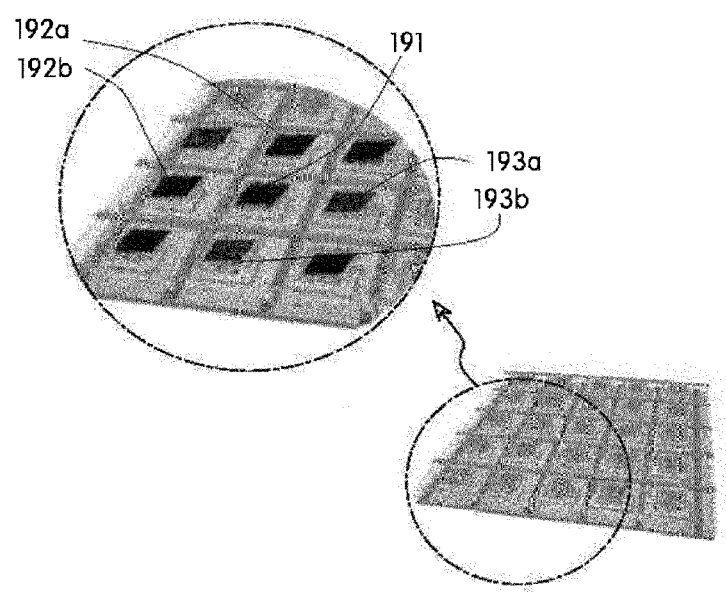
FIG. 21 is a perspective view of a display according to another embodiment of the present invention.

FIG. 21 is a perspective view of a display according to another embodiment of the present invention. Each of sub pixels includes nano-scale LED devices that emit light having only one color of blue colors 192a and 192b, green colors 193a and 193b, and a red color 191 to realize the sub pixel that emits blue, green, and red light. In the full-color RGB display, the blue, green, and red sub pixels may be arranged so that different colors (for example, blue colors 192a and 192b and green colors 193a and 193b) are disposed on the sub pixels adjacent in horizontal and vertical directions by using the sub pixel (for example, red color 191) having one color.

Figure 22:
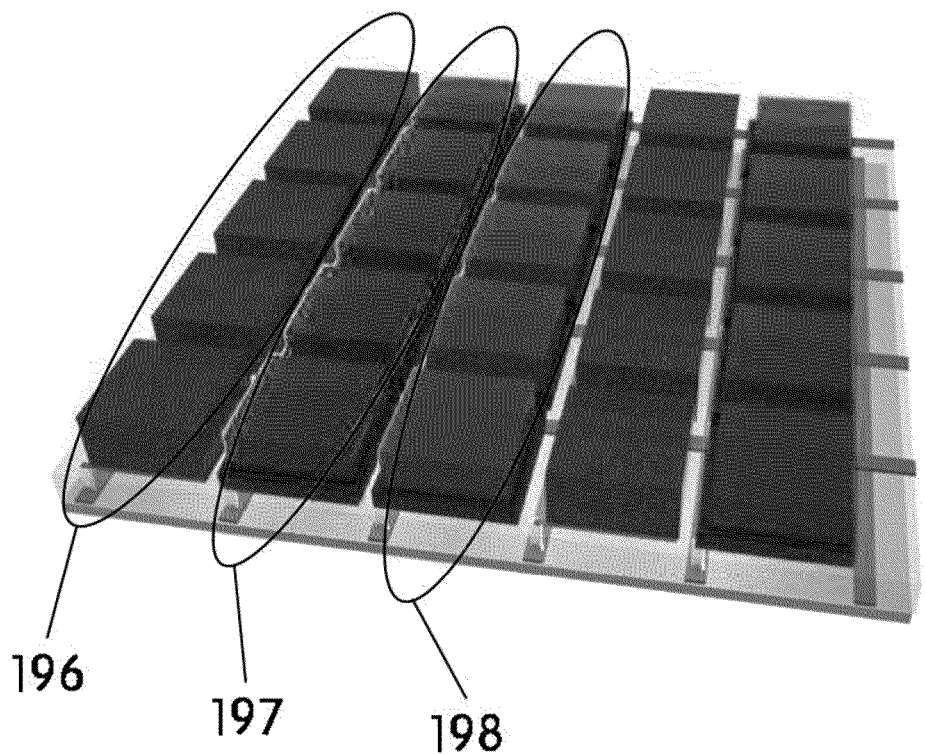
FIG. 22 is a perspective view of a display according to another embodiment of the present invention.

Also, FIG. 22 is a perspective view of a display according to another embodiment of the present invention. Colors different from each other are disposed for horizontal or vertical sub pixel lines including a plurality of sub pixels. For instance, a blue color 196, a green color 197, and a red color 198 may be disposed for the vertical sub pixel line.

A method for manufacturing a display according to a third embodiment of the present invention may further include: after the step (4), a step (5) of forming a metal ohmic layer including a connection portion between first and second electrodes provided in a plurality of sub pixels to nano-scale LED devices; and a step (6) of forming a passivation layer on upper portions of the plurality of sub pixels including the metal ohmic layer. Detailed descriptions of the steps (5) and (6) are the same as those in the method for manufacturing the display according to the first embodiment of the present invention, and thus, their detailed descriptions will be omitted.

Also, after the step (6), the method for manufacturing the display may further include a process of forming a short-wave pass filter and a process of forming a long-wave pass filter.

According to a fourth embodiment of the present invention, a method for manufacturing a display including a nano-scale LED assembly includes: (1) forming an electrode I on a substrate; (2) forming an electrode II on the same plane as the electrode I or on the electrode I to form a plurality of electrode assembles including a first electrode connected to the electrode I and a second electrode spaced apart from the first electrode on the same plane as the first electrode and connected to the electrode II; (3) independently injecting a plurality of blue nano-scale LED devices, a plurality of green nano-scale LED devices, and a plurality of red nano-scale LED devices onto a plurality of sub pixel sites formed on the plurality of electrode assemblies; and (4) injecting a solvent to the plurality of sup pixel sites and applying power to the plurality of electrode assemblies to form a plurality of sub pixels including a plurality of nano-scale LED devices connected to both of the first and second electrodes; wherein each of the nano-scale LED devices includes: a first electrode layer, a first conductive type semiconductor layer formed on the first electrode layer;

an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm<X≤10 μm, 100 nm<Y≤10 μm, and 100 nm<Z≤10 μm.

More preferably, the relation expression 1 may satisfy a following condition: Z≤H<X+Y+2Z, more preferably, the relation expression 2 may satisfy a following condition: Z≤H≤X+Y+Z. Since this has been described above, their detailed descriptions will be omitted.

In a fourth embodiment of the present invention, duplicated portions with the manufacturing method according to the third embodiment will be omitted.

In the fourth embodiment of the present invention, a step (1) and a step (2) are the same as those of the first embodiment. However, the fourth embodiment of the present invention is different from the third embodiment of the present invention in that a blue nano-scale LED device, a red nano-scale LED device, and a green nano-scale LED device, but not the first to third solutions containing the nano-scale LED devices having colors different from each other may be injected to the sub pixel sites in a step (3).

In case of the display manufactured according to the third embodiment, since the nano-scale LED device is injected in a solution state, nano-scale LED devices may be aggregated in a sub pixel site and then disposed at a specific portion or be floated in the solution and thus spread to an edge of the sub pixel site so that the nano-scale LED devices are concentratedly mounted on the edge of the sub pixel site.

The fourth embodiment of the present invention may provide solve the above-described limitation. That is, the nano-scale LED devices may be concentrated and mounted into a desired region of sub pixel site and also be uniformly dispersed and mounted on the desired region to minimize the aggregation of the nano-scale LED devices.

For this, according to the fourth embodiment of the present invention, the nano-scale LED devices may not be injected into the sub pixel site in the solution state. That is, the nano-scale LED devices may be injected, and then a solvent for moving the nano-scale LED devices may be injected in a step (4). Then, power is applied to allow the nano-scale LED devices to be concentratedly mounted in the desired sub pixel site.

When compared to the second embodiment of the present invention, in the fourth embodiment of the present invention, a method for injecting nano-scale LED devices onto the sub pixel sites in a step (3) and a kind and amount of solvent injected in a step (4), power applied to an electrode assembly, and an order of the injection of the solvent and the applying of the power are the same except that the nano-scale LED devices injected to the sub pixel sites are blue, red, and green nano-scale LED devices, and the RGB full-color LED display is realized without the color conversion layer, and thus, their detailed descriptions according to the fourth embodiment of the present invention will be omitted.

The display manufactured according to the third or fourth embodiment of the present invention includes: an electrode I disposed on a substrate; an electrode II on the same plane as the electrode I or on the electrode I; a plurality of electrode assembles comprising a first electrode connected to the electrode I and a second electrode spaced apart from the first electrode on the same plane as the first electrode and connected to the electrode II; and a plurality of nano-scale LED devices connected to both of the first and second electrodes provided on a plurality of sub pixel sites disposed on the plurality of electrode assembles, wherein the nano-scale LED devices includes: a plurality of blue nano-scale LED devices, green nano-scale LED devices, and red nano-scale LED devices, wherein the nano-scale LED devices that emit light having one kind of color are disposed on each of the sub pixel sites, each of the nano-scale LED device includes: a first electrode layer, a first conductive type semiconductor layer formed on the first electrode layer; an active layer formed on the first conductive type semiconductor layer; a second conductive type semiconductor layer formed on the active layer; and a second electrode layer formed on the second conductive type semiconductor layer, the nano-scale LED device further includes an insulation film, which covers an entire outer surface of a portion of at least the active layer to prevent an electrical short-circuit occurring due to contact between the active layer of the nano-scale LED device and the electrode assembly from occurring, on an outer surface thereof, and a width X of the first electrode, a width Y of the second electrode, a distance Z between the first electrode and the second electrode adjacent to the first electrode, and a length H of the nano-scale LED device satisfy following relation expression 1.

$$0.5Z \leq H < X+Y+2Z,$$ [Relation Expression 1]

where 100 nm<X≤10 μm, 100 nm<Y≤10 μm, and 100 nm<Z≤10 μm.

More preferably, the relation expression 1 may satisfy a following condition: Z≤H<X+Y+2Z, more preferably, the relation expression 2 may satisfy a following condition: Z≤H≤X+Y+Z. Since this has been described above, their detailed descriptions will be omitted.

The display according to the present invention may further include: an insulation layer disposed on the substrate in addition to the electrode I and the electrode II; and a metal ohmic layer including connection portions between the first and second electrode which are provided in the plurality of sub pixels to the nano-scale LED devices. Also, the display may further include an insulation barrier surrounding each of the plurality of sub pixels sites and disposed on the substrate in addition to the plurality of electrode assembles.

The insulation layer disposed on the substrate in addition to the electrode I may prevent the electrode II and the electrode from being electrically short-circuited. The metal ohmic layer may minimize contact resistance that exists when the electrode and the nano-scale LED device are electrically connected to each other to significantly improve light emitting efficiency. The insulation barrier may prevent the nano-scale LED devices from being connected to the electrode at an edge of the sub pixel or an undesired portion. Detailed descriptions of the display are the same as those of the display manufactured according to the first or second embodiment of the present invention, and thus, their detailed descriptions will be omitted.

Also, in the display, the number of nano-scale LED device per an area (100×100 µm²) of the sub pixel may be about 10 to about 100,000. The nano-scale LED device may have a diameter of about 100 nm to about 10 µm.

Although the present invention is specifically described through following Examples, the present invention is not limited to the following Examples, and also Examples are described to provide more general understandings of the present invention.

Example 1

An electrode assembly as illustrated in FIG. 1 was manufactured on a substrate formed of quartz and having a thickness of about 800 µm. Here, in the electrode assembly, an electrode I has a width of about 3 µm, a first electrode has a width of about 3 µm, an electrode II has a width about 3 µm, a second electrode has a width about 3 µm, a distance between the first electrode and the second electrode is about 2 µm, and each of the electrodes has a thickness of about 2 µm. Also, each of the electrodes I and II and the first and second electrodes is formed of a titanium/gold material, an insulation layer formed on a substrate is formed of silicon dioxide in the electrode assembly, and the substrate has a thickness of about 0.5 µm. In the electrode assembly, a single sub pixel site on which a nano-scale LED device is mounted has an area of about 4.2×107 µm². Thereafter, an insulation barrier as illustrated in FIG. 6 was formed on the base substrate. The insulation barrier was formed of silicon dioxide, and a height from the base substrate to an end of the insulation barrier is about 0.5 µm. Here, the insulation barrier was formed on the base substrate except for the region (area of 4.2×107 µm²) on which the nano-scale LED device is mounted in the electrode assembly.

Then, the nano-scale LED device having a specification of following Table 1 and the structure of FIG. 9 and coated to a thickness of about 0.02 µm with an insulation film on an outer surface of the active layer of the nano-scale LED device was mixed by about 1.0 weight part with respect to 100 weight part of acetone to manufacture a solution containing the nano-scale LED devices.

The manufactured solution dropped into the sub pixel site surrounded by the insulation barrier on the base substrate to apply AC power having a voltage of VAC=30 V and a frequency of about 950 kHz to the electrode assembly for one minute, thereby manufacturing the display including the nano-scale LED electrode assembly.

TABLE 1

|  | Material | Length (µm) | Diameter (µm) |
|---|---|---|---|
| First electrode layer | Chrome | 0.03 | 0.6 |
| First conductive type semiconductor layer | n-GaN | 1.64 | 0.6 |
| Active layer | InGaN | 0.1 | 0.6 |
| Second conductive type semiconductor layer | p-GaN | 0.2 | 0.6 |
| Second electrode layer | Chrome | 0.03 | 0.6 |
| Insulation film | Aluminum oxide |  | 0.02 (Thickness) |
| Nano-scale LED device |  | 2 | 0.62 |

Example 2

Although the same process as Example 1 is performed, the insulation barrier is not formed, and nano-scale LED devices dropped onto a sub pixel site without the insulation barrier to manufacture a display including a nano-scale LED electrode.

Example 3

Although the same process as Example 1 is performed, nano-scale LED devices were injected to sub pixel sites, instead that the solution containing the nano-scale LED devices drops into the sub pixel sites surrounded by the insulation barrier on the base substrate. Then, acetone was injected into the region in which the nano-scale LED devices are injected. Here, the injected acetone has about 10,000 weight part with respect to 100 weight part of the nano-scale LED devices. While the solvent is injected, AC power having a voltage of VAC=30 V and a frequency of about 950 kHz was applied to the electrode assembly for one minute to manufacture the nano-scale LED electrode assembly.

Example 4

Silicon dioxide (SiO2) was printed to a thickness of about 10 µm on an upper portion of a display including nano-scale LED devices manufactured according to the Example 1 to form a passivation layer. Then, $TiO_2$ and $SiO_2$ were deposited on an upper portion of the passivation layer in order of $TiO_2$—$SiO_2$—$TiO_2$—$SiO_2$—$TiO_2$ by using E-beam deposition to form a short-wave pass filter having a thickness of about 0.9 µm. Thereafter, a portion of the sub pixel site was selected to form a solution for green color conversion (a green phosphor having a composition of SrGa2S4:Eu and a silicon binder are mixed to about 20 wt % of a phosphor concentration) through a screen printing method so that a final green color conversion layer has a thickness of about 200 µm.

Also, a portion of the sub pixel site was selected to form a solution for red color conversion (a red phosphor having a composition of (Sr,Ca)AlSiN$_3$:Eu and a silicon binder are mixed to about 20 wt % of a phosphor concentration) through a screen printing method so that a final red color conversion layer has a thickness of about 200 µm.

Thereafter, TiO2 and SiO2 were deposited on the green color conversion layer and the red color conversion layer in order of $TiO_2$—$SiO_2$—$TiO_2$—$SiO_2$—$TiO_2$ through the E-beam deposition to form a long-wave pass filter having a thickness of about 0.9 µm, thereby manufacturing a green color conversion pixel and a red color conversion pixel.

Comparative Example

Although the same process as Example 1 is performed, the nano-scale LED electrode assembly was manufactured by using nano-scale LED devices in which the insulation barrier is not provided on a portion of the active layer of the nano-scale LED device.

Experimental Example

In the nano-scale LED electrode assembly manufactured in Examples 1 and 2 and Comparative Example, AC power having a voltage of about VAC=30 V and a frequency of about 950 kHz is applied to the electrode assembly for one minute to observe the number of nano-scale LED devices that emits blue light through an optical microscope. Then, the number is counted to obtain following Table 2.

TABLE 2

| | Number of nano-scale LED device emitting blue light |
|---|---|
| Example 1 | 8604 |
| Example 2 | 4508 |
| Example 3 | 8945 |
| Comparative Example | 2792 |

As seen in Table 2, in case of a display according to Comparative Example in which an insulation film is not provided on an active layer of a nano-scale LED device, the number of nano-scale LED devices that emits blue light is significantly less than those of Example 1 to 3. Thus, it is sent that the active layer of the nano-scale LED device contacts the electrode to frequently cause electrical short-circuit.

Also, in case of Example 2 in which the solution containing the nano-scale LED devices is injected into the electrode assembly in which the insulation barrier is not provided, the number of nano-scale LED devices that emit blue light is less than that in Example 1. Thus, it is seen that the number of nano-scale LED devices electrically connected to the electrode assembly because, when the solution containing the nano-scale LED devices is injected into the electrode assembly in which the insulation barrier is not provided, the nano-scale LED devices are spread to the outside of the sub pixels, on which the nano-scale LED devices are not mounted.

Also, when compared to Example 1 in which the nano-scale LED devices having the solution state is injected, it is seen that the number of nano-scale LED devices that emits the blue light significantly increases in Example 3 in which the nano-scale LED devices are injected, and then the solution is injected while the power is applied. Thus, when the nano-scale LED devices having the solution state are injected, it is seen that the spread of the nano-scale LED devices into the region in which the devices are not mounted increases, and the LED devices that are not mounted exit.

Experimental Example 2

A voltage required for self-aligning the nano-scale LED devices according to the aspect ratio of the nano-scale LED devices was measured. Here, the aspect ratio of the nano-scale LED devices was measured by using the nano-scale LED devices manufactured by changing as shown in Table 3. Also, a minimum voltage for stating the self-alignment of the nano-scale LED devices was measured as shown in Table 3.

TABLE 3

| | Length (H, μm) | Diameter (D, μm) | Aspect ratio (AR = H/D) | Applied voltage (V) |
|---|---|---|---|---|
| Example 5 | 2 | 2 | 1 | — |
| Example 6 | 2 | 1.7 | 1.2 | 262 |
| Example 7 | 2 | 1.5 | 1.3 | 136 |
| Example 8 | 2 | 1.2 | 1.7 | 73 |
| Example 9 | 2 | 1 | 2 | 53 |
| Example 10 | 2 | 0.8 | 2.5 | 40 |
| Example 11 | 2 | 0.4 | 5 | 23 |
| Example 12 | 2 | 0.2 | 10 | 15 |

As seen in Table 3, it is seen that the required voltage significantly increases to self-align the nano-scale LED devices when the aspect ratio of the nano-scale LED devices decreases. In case of Example 5 in which the aspect ratio of nano-scale LED devices is less than about 1.2, in spite that the voltage of the power increases, the self-alignment of the nano-scale LED devices to the electrode is impossible. Also, in case of Examples 6 and 7 in which the aspect ratios of the nano-scale LED devices are about 1.2 and about 1.3, respectively, it is seen that the voltage required for self-aligning the nano-scale LED devices significantly increases when compared to that in Example 8.

Experimental Example 3

The display including a nano-scale LED device manufactured in Examples 1 and 3 were magnified to 1,500 times to photograph the magnified nano-scale assemblies by using the optical microscope. The results were illustrated in FIG. 11 in Example 1 and illustrated in FIG. 14 in Example 3, respectively.

As illustrated in FIG. 15, in case of Example 3, it is sent that the nano-scale LED devices are concentratedly self-aligned to the desired portion of the electrode without being concentrated to the outside, whereas, in case of Example 1 of FIG. 14, it is seen that the nano-scale LED devices are self-aligned to be spread outward from the desired center of the electrode region, and the aggregation of the nano-scale LED devices significantly occurs.

Experimental Example 4

A frequency of about 950 KHz and a voltage of about to vpp were applied to a blue pixel, a green color conversion pixel, a red color conversion pixel, which include nano-scale blue LED devices of a display manufactured in Example 4 to operate, thereby measuring color coordinate and emission spectrum by using a spectrophotometer (manufactured by PSI company). An area ratio based on the color reproduction range of TV made by the regulation of the national television standard committee through the measured results to obtain following Table 4 and also the results were illustrated in FIG. 22.

TABLE 4

| | Color coordinate | | |
|---|---|---|---|
| | CIEx | CIEy | Color reproduction range |
| Blue pixel | 0.164 | 0.023 | 73.4% |
| Green color conversion pixel | 0.335 | 0.631 | |
| Red color conversion pixel | 0.633 | 0.335 | |

As shown in Table 4, it is seen that a color reproduction range is similar to that of the existing LCD TV, i.e., about 73.4% in comparison with NTSC.

Figure 23:
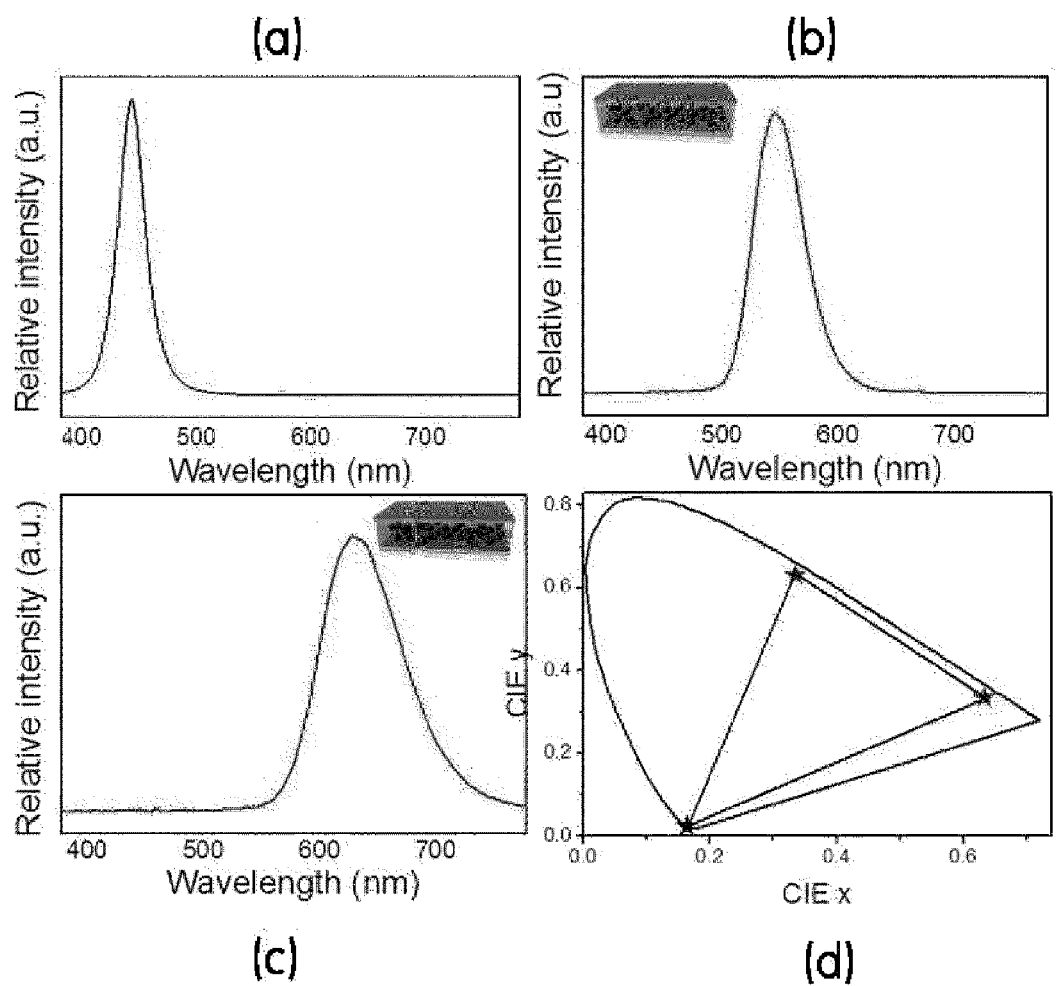
FIG. 23 is a color coordinate and an emission spectrum of the display according to an embodiment of the present invention.

FIG. 23 is a color coordinate and an emission spectrum of the display according to an embodiment of the present invention. FIG. 23A illustrates an emission spectrum of a blue pixel, FIG. 23B illustrates an emission spectrum of a green color conversion pixel, FIG. 23C illustrates an emission spectrum of a red color conversion pixel, and FIG. 23D illustrates a coordinate graph.

Referring to FIGS. 23A to 23C, it is confirmed that the blue, green, and red emission are well realized. Also, it is seen that the color reproduction range is adequate for the display with reference to FIG. 23D.

In the display including the nano-scale LED and the method for manufacturing the same, the high-dense nano-scale LED device having the nano unit may be coupled to the two nano-scale electrodes different from each other, which are provided in one sub pixel, to one-to-one correspond to each other, may be connected without the electrical short-circuit, and may be concentratedly disposed and connected on the desired mounting region in the electrode assembly. Also, in the LED display according to the related art, since the sub pixel is disposed on the electrode, the photons generated in the active layer of the nano-scale LED device are blocked by the electrode and thus not extracted, but are absorbed into the device to realize low light extraction efficiency. However, according to the present invention, the sub pixel may be changed in position to significantly improve the light extraction efficiency. Also, due to the directivity depending on the relative position relationship between the nano-scale LED device connected to the electrode, the electrode, and the substrate, i.e., due to the arrangement of the nano-scale LED devices horizontally disposed with respect to the substrate, the photons an amount of photons emitted to the air among the photons generated in the active layer may increase to significantly improve the light extraction efficiency of the nano-scale LED device. Furthermore, to prevent the defective pixel and the defect of the whole display due to the defect of the nano-scale LED device from occurring, the plurality of high-dense nano-scale LED devices may be provided in the sub pixel to minimize the defect of the display including the nano-scale LEDs and maintain its original function. Furthermore, if the nano-scale LED devices do not stand up and are not three-dimensionally coupled to the upper and lower electrodes, unlike the LED display according to the related art, since the nano-scale LEDs are easily self-assembled between the two electrodes different from each other without directly growing the LED devices on the large-area substrate, the large-area LED display in which the nano-scale LEDs are operably arranged on a large-scale plane may be produced.

Although embodiments have been described with reference to a number of illustrative embodiments thereof, it should be understood that numerous other modifications and embodiments can be devised by those skilled in the art that will fall within the spirit and scope of the principles of this invention. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a display comprising a nano-scale LED assembly, the method comprising:
    (1) forming an electrode I on a substrate;
    (2) forming an electrode II on the same plane as the electrode I or on the electrode I to form a plurality of electrode assembles comprising a first electrode connected to the electrode I and a second electrode spaced apart from the first electrode on the same plane as the first electrode and connected to the electrode II;
    (3) injecting a solution containing a plurality of nano-scale LED devices onto a plurality of sub pixel sites formed on the plurality of electrode assembles; and
    (4) applying power to the plurality of electrode assembles to form a plurality of sub pixels comprising the plurality of nano-scale LED devices connected to both of the first and second electrodes,
    wherein each of the plurality of nano-scale LED devices comprises a first electrode layer, a first conductive type semiconductor layer formed on the first electrode layer, an active layer formed on the first conductive type semiconductor layer, a second conductive type semiconductor layer formed on the active layer, a second electrode layer formed on the second conductive type semiconductor layer, and an insulation film which covers an entire outer surface of a portion of at least the active layer to prevent an electrical short-circuit occurring due to contact between the active layer and the electrode assembly from occurring, on an outer surface thereof, and
    wherein a width X of the first electrode, a width Y of the second electrode, a distance Z between the first electrode and the second electrode adjacent to the first electrode, and a length H of the nano-scale LED device satisfy following relation expression 1

$$0.5Z \leq H < X+Y+2Z,$$ [Relation Expression 1]

where 100 nm$<X \leq 10$ µm, 100 nm$<Y \leq 10$ µm, and 100 nm$<Z \leq 10$ µm.

2. A method for manufacturing a display comprising a nano-scale LED assembly, the method comprising:
    (1) forming an electrode I on a substrate;
    (2) forming an electrode II on the same plane as the electrode I or on the electrode I to form a plurality of electrode assembles comprising a first electrode connected to the electrode I and a second electrode spaced apart from the first electrode on the same plane as the first electrode and connected to the electrode II;
    (3) independently injecting a first solution containing a plurality of blue nano-scale LED devices, a second solution containing a plurality of green nano-scale LED devices, and a third solution containing a plurality of red nano-scale LED devices onto a plurality of sub pixel sites formed on the plurality of electrode assembles; and
    (4) applying power to the plurality of electrode assembles to form a plurality of sub pixels comprising the plurality of nano-scale LED devices connected to both of the first and second electrodes,
    wherein each of the plurality of nano-scale LED devices comprises a first electrode layer, a first conductive type semiconductor layer formed on the first electrode layer, an active layer formed on the first conductive type semiconductor layer, a second conductive type semiconductor layer formed on the active layer, a second electrode layer formed on the second conductive type semiconductor layer, and an insulation film which covers an entire outer surface of a portion of at least the active layer to prevent an electrical short-circuit occurring due to contact between the active layer and the electrode assembly from occurring, on an outer surface thereof, and
    wherein a width X of the first electrode, a width Y of the second electrode, a distance Z between the first electrode and the second electrode adjacent to the first electrode, and a length H of the nano-scale LED device satisfy following relation expression 1

$$0.5Z \leq H < X+Y+2Z,$$ [Relation Expression 1]

where 100 nm$<X \leq 10$ µm, 100 nm$<Y \leq 10$ µm, and 100 nm$<Z \leq 10$ µm.

3. The method of claim 1, further comprising forming an insulation layer comprising the electrode I on the substrate between the step (1) and the step (2),
    each of the plurality of nano-scale LED devices in the step (3) has a length of about 100 nm to about 10 µm and an aspect ratio of about 1.2 to about 100, wherein the plurality of nano-scale LED devices includes a blue LED device, the power in the step (4) has a voltage of about 0.1 V to about 1,000 V and a frequency of about 10 Hz to about 100 GHz, and the number of nano-scale LED devices provided per an area (100×100 µm$^2$) of the sub pixel site in the step (4) is about 2 to about 100,000, and after the step (4), the method further comprises:

(5) forming a metal ohmic layer comprising connection portions between the first and second electrodes provided on the plurality of sub pixels and the plurality of nano-scale LED devices;

(6) forming a short-wave pass filter (SPDF) on an upper portion of each of the plurality of sub pixels comprising the metal ohmic layer;

(7) patterning a green color conversion layer on an upper portion of the short-wave pass filter (SPDF) corresponding to the selected sub pixels of the plurality of sub pixels and patterning a red color conversion layer on an upper portion of the short-wave pass filter (SPDF) corresponding to the selected sub pixels of the plurality of sub pixels; and (8) forming a long-wave pass filter (LPDF) on upper portions of the green color conversion layer and the red color conversion layer.

4. The method of claim 1, further comprising forming an insulation barrier surrounding the plurality of sub pixel sites formed on the plurality of electrode assemblies on the substrate in addition to the electrode assembly between the step (2) and the step (3).

5. The method of claim 2, further comprising forming an insulation layer comprising the electrode I on the substrate between the step (1) and the step (2), each of the plurality of nano-scale LED devices in the step (3) has a length of about 100 nm to about 10 µm and an aspect ratio of about 1.2 to about 100, wherein the plurality of nano-scale LED devices includes a blue LED device, the power in the step (4) has a voltage of about 0.1 V to about 1,000 V and a frequency of about 10 Hz to about 100 GHz, and the number of nano-scale LED devices provided per an area (100×100 µm$^2$) of the sub pixel site in the step (4) is about 2 to about 100,000, and after the step (4), the method further comprises:

(5) forming a metal ohmic layer comprising connection portions between the first and second electrodes provided on the plurality of sub pixels and the plurality of nano-scale LED devices; and (6) forming a passivation layer on an upper portion of each of the plurality of sub pixels comprising the metal ohmic layer.

6. The method of claim 2, further comprising forming an insulation barrier surrounding the plurality of sub pixel sites formed on the plurality of electrode assemblies on the substrate in addition to the electrode assemblies between the step (2) and the step (3).

7. A method for manufacturing a display comprising a nano-scale LED assembly, the method comprising:

(1) forming an electrode I on a substrate;

(2) forming an electrode II on the same plane as the electrode I or on the electrode I to form a plurality of electrode assemblies comprising a first electrode connected to the electrode I and a second electrode spaced apart from the first electrode on the same plane as the first electrode and connected to the electrode II;

(3) injecting a plurality of nano-scale LED devices onto a plurality sub pixel sites formed on the plurality of electrode assembles; and (4) injecting a solvent to the plurality of sub pixel sites and applying power to the plurality of electrode assembles to form a plurality of sub pixels comprising a plurality of nano-scale LED devices connected to both of the first and second electrodes, wherein each of the plurality of nano-scale LED devices comprises a first electrode layer, a first conductive type semiconductor layer formed on the first electrode layer, an active layer formed on the first conductive type semiconductor layer, a second conductive type semiconductor layer formed on the active layer, a second electrode layer formed on the second conductive type semiconductor layer, and an insulation film which covers an entire outer surface of a portion of at least the active layer to prevent an electrical short-circuit occurring due to contact between the active layer and the electrode assembly from occurring, on an outer surface thereof, and wherein a width X of the first electrode, a width Y of the second electrode, a distance Z between the first electrode and the second electrode adjacent to the first electrode, and a length H of the nano-scale LED device satisfy following relation expression 1

$0.5Z \leq H < X+Y+2Z$, [Relation Expression 1]

where 100 nm<X≤10 µm, 100 nm<Y≤10 µm, and 100 nm<Z≤10 µm.

8. A method for manufacturing a display comprising a nano-scale LED assembly, the method comprising:

(1) forming an electrode I on a substrate;

(2) forming an electrode II on the same plane as the electrode I or on the electrode I to form a plurality of electrode assemblies comprising a first electrode connected to the electrode I and a second electrode spaced apart from the first electrode on the same plane as the first electrode and connected to the electrode II;

(3) independently injecting a plurality of blue nano-scale LED devices, a plurality of green nano-scale LED devices, and a plurality of red nano-scale LED devices onto a plurality of sub pixel sites formed on the plurality of electrode assembles; and (4) injecting a solvent to the plurality of sub pixel sites and applying power to the plurality of electrode assembles to form a plurality of sub pixels comprising a plurality of nano-scale LED devices connected to both of the first and second electrodes;

wherein each of the plurality of nano-scale LED devices comprises a first electrode layer, a first conductive type semiconductor layer formed on the first electrode layer, an active layer formed on the first conductive type semiconductor layer, a second conductive type semiconductor layer formed on the active layer, a second electrode layer formed on the second conductive type semiconductor layer, and an insulation film which covers an entire outer surface of a portion of at least the active layer to prevent an electrical short-circuit occurring due to contact between the active layer and the electrode assembly from occurring, on an outer surface thereof, and wherein a width X of the first electrode, a width Y of the second electrode, a distance Z between the first electrode and the second electrode adjacent to the first electrode, and a length H of the nano-scale LED device satisfy following relation expression 1

$0.5Z \leq H < X+Y+2Z,$  [Relation Expression 1]

where 100 nm$<$X$\leq$10 μm, 100 nm$<$Y$\leq$10 μm, and 100 nm$<$Z$\leq$10 μm.

9. A display comprising a nano-scale LED, the display comprising:
   an electrode I disposed on a substrate;
   an electrode II on the same plane as the electrode I or on the electrode I;
   a plurality of electrode assembles comprising a first electrode connected to the electrode I and a second electrode spaced apart from the first electrode on the same plane as the first electrode and connected to the electrode II; and
   a plurality of nano-scale LED devices connected both of to the first and second electrodes provided on a plurality of sub pixel sites disposed on the plurality of electrode assembles,
   wherein each of the plurality of nano-scale LED devices comprises a first electrode layer, a first conductive type semiconductor layer formed on the first electrode layer, an active layer formed on the first conductive type semiconductor layer, a second conductive type semiconductor layer formed on the active layer, a second electrode layer formed on the second conductive type semiconductor layer, and an insulation film which covers an entire outer surface of a portion of at least the active layer to prevent an electrical short-circuit occurring due to contact between the active layer and the electrode assembly from occurring, on an outer surface thereof, and
   wherein a width X of the first electrode, a width Y of the second electrode, a distance Z between the first electrode and the second electrode adjacent to the first electrode, and a length H of the nano-scale LED device satisfy following relation expression 1

$0.5Z \leq H < X+Y+2Z,$  [Relation Expression 1]

where 100 nm$<$X$\leq$10 μm, 100 nm$<$Y$\leq$10 μm, and 100 nm$<$Z$\leq$10 μm.

10. A display comprising a nano-scale LED, the display comprising:
    an electrode I disposed on a substrate;
    an electrode II on the same plane as the electrode I or on the electrode I;
    a plurality of electrode assembles comprising a first electrode connected to the electrode I and a second electrode spaced apart from the first electrode on the same plane as the first electrode and connected to the electrode II; and
    a plurality of nano-scale LED devices connected both of to the first and second electrodes provided on a plurality of sub pixel sites disposed on the plurality of electrode assembles,
    wherein the plurality of nano-scale LED devices comprise a plurality of blue nano-scale LED devices, green nano-scale LED devices, and red nano-scale LED devices, wherein the plurality of nano-scale LED devices that emit light having one kind of color are disposed on each of the sub pixel sites,
    wherein each of the plurality of nano-scale LED device comprises a first electrode layer, a first conductive type semiconductor layer formed on the first electrode layer, an active layer formed on the first conductive type semiconductor layer, a second conductive type semiconductor layer formed on the active layer, a second electrode layer formed on the second conductive type semiconductor layer, and an insulation film which covers an entire outer surface of a portion of at least the active layer to prevent an electrical short-circuit occurring due to contact between the active layer and the electrode assembly from occurring, on an outer surface thereof, and
    wherein a width X of the first electrode, a width Y of the second electrode, a distance Z between the first electrode and the second electrode adjacent to the first electrode, and a length H of the nano-scale LED device satisfy following relation expression 1

$0.5Z \leq H < X+Y+2Z,$  [Relation Expression 1]

where 100 nm$<$X$\leq$10 μm, 100 nm$<$Y$\leq$10 μm, and 100 nm$<$Z$\leq$10 μm.

11. The display of claim 9, further comprising:
    an insulation layer comprising the electrode I and disposed on the substrate and under the electrode II;
    a metal ohmic layer comprising connection portions between the first and second electrodes disposed on the plurality of sub pixels and the plurality of nano-scale LED devices;
    a short-wave pass filter (SPDF) disposed on an upper portion of each of the plurality of sub pixels comprising the metal ohmic layer;
    a green color conversion layer patterned on an upper portion of the short-wave pass filter (SPDF) corresponding to the selected sub pixels of the plurality of sub pixels and a red color conversion layer patterned on an upper portion of the short-wave pass filter (SPDF) corresponding to the selected sub pixels of the plurality of sub pixels; and
    a long-wave pass filter (LPDF) disposed on upper portions of the green color conversion layer and the red color conversion layer.

12. The display of claim 9, further comprising an insulation barrier surrounding each of the plurality of sub pixel sites and formed on the substrate in addition to the plurality of electrode assembles.

13. The display of claim 9, wherein the width X of the first electrode, the width Y of the second electrode, the distance Z between the first electrode and the second electrode adjacent to the first electrode, and the length H satisfy following relation expression 2

$Z \leq H \leq X+Y+Z,$  [Relation Expression 2]

where 100 nm$<$X$\leq$10 μm, 100 nm$<$Y$\leq$10 μm, and 100 nm$<$Z$\leq$10 μm.

14. The display of claim 9, wherein the electrodes I and II cross each other in a strip shape, the sub pixel sites are disposed in a space partitioned by the electrodes I and II, the number of nano-scale LED devices provided per an area (100×100 μm$^2$) of the sub pixel site is about 2 to about 100,000, each of the plurality of nano-scale LED devices has a length of about 100 nm to about 10 μm and an aspect ratio of about 1.2 to about 100, and the plurality of nano-scale LED devices includes a blue LED device.

15. The display of claim 10, further comprising an insulation barrier surrounding each of the plurality of sub pixel sites and disposed on the substrate in addition to the plurality of electrode assembles.

* * * * *